United States Patent
Shim

(10) Patent No.: US 8,115,258 B2
(45) Date of Patent: Feb. 14, 2012

(54) MEMORY DEVICES HAVING DIODES AND RESISTORS ELECTRICALLY CONNECTED IN SERIES

(75) Inventor: Byung Sup Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 217 days.

(21) Appl. No.: 12/661,117

(22) Filed: Mar. 11, 2010

(65) Prior Publication Data

US 2010/0252894 A1 Oct. 7, 2010

(30) Foreign Application Priority Data

Apr. 7, 2009 (KR) ........................ 10-2009-0030006

(51) Int. Cl.
*H01L 29/861* (2006.01)

(52) U.S. Cl. ................. 257/379; 257/536; 257/E27.044; 257/E45.002

(58) Field of Classification Search ................... 257/381, 257/601, E27.044
See application file for complete search history.

(56) References Cited

U.S. PATENT DOCUMENTS

| | | | |
|---|---|---|---|
| 6,605,527 B2 | 8/2003 | Dennison et al. | |
| 7,052,941 B2 | 5/2006 | Lee | |
| 7,247,876 B2 | 7/2007 | Lowrey | |
| 7,307,268 B2 * | 12/2007 | Scheuerlein | 257/2 |
| 7,378,702 B2 | 5/2008 | Lee | |
| 7,858,468 B2 * | 12/2010 | Liu et al. | 438/237 |
| 2006/0186483 A1 | 8/2006 | Cho et al. | |
| 2006/0250837 A1 * | 11/2006 | Herner et al. | 365/148 |
| 2006/0275962 A1 | 12/2006 | Lee | |
| 2008/0026547 A1 | 1/2008 | Yin et al. | |
| 2008/0303016 A1 * | 12/2008 | Cho et al. | 257/5 |
| 2010/0314598 A1 * | 12/2010 | Park | 257/2 |
| 2011/0163390 A1 * | 7/2011 | Sandhu | 257/401 |

FOREIGN PATENT DOCUMENTS

| | | |
|---|---|---|
| JP | 2008-34809 A | 2/2008 |
| KR | 10-0609527 B1 | 7/2006 |
| KR | 10-2008-0010621 A | 1/2008 |

* cited by examiner

*Primary Examiner* — Stephen W Smoot

(74) *Attorney, Agent, or Firm* — Onello & Mello, LLP

(57) ABSTRACT

A non-volatile memory devices includes: a substrate including a circuit device and a metal line electrically connected with the circuit device; a diode connected with the metal line in a vertical direction with respect to a surface of the substrate, and including a metal layer disposed on a lower part of the diode facing the surface of the substrate; and a resistor electrically connected with the diode in series.

12 Claims, 24 Drawing Sheets

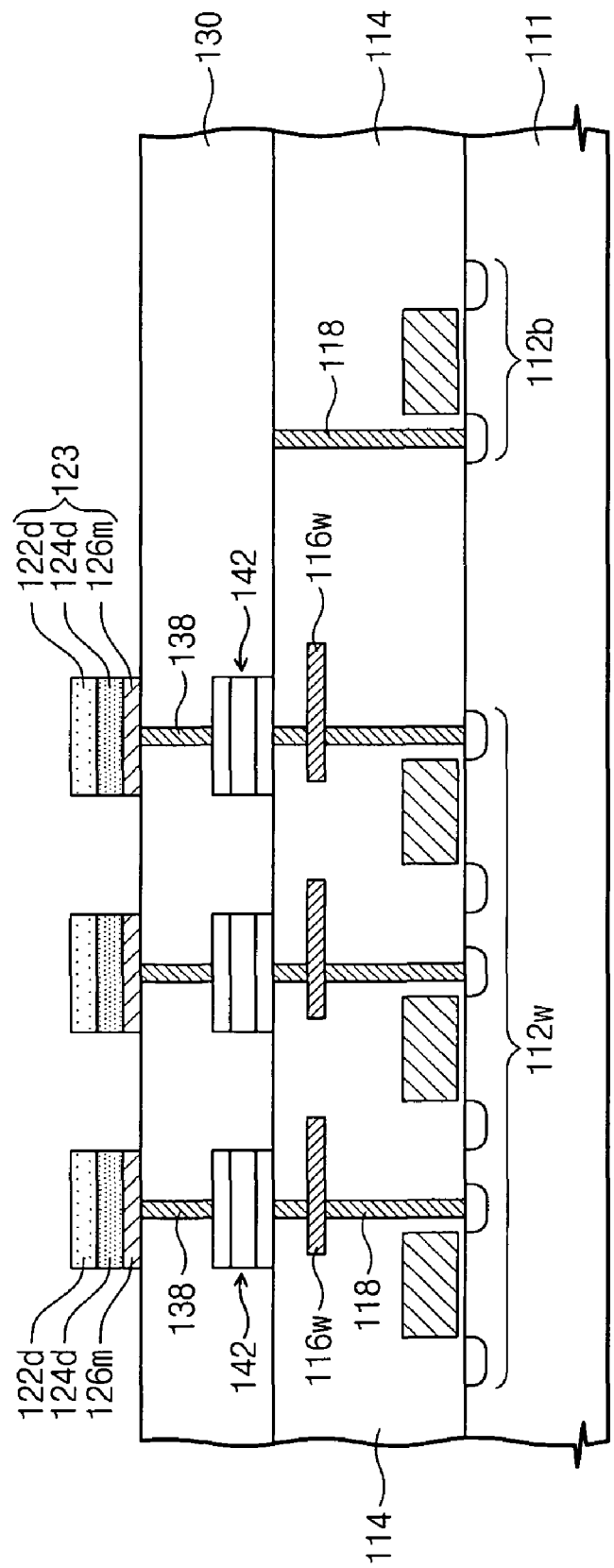

MEMORY DEVICES HAVING DIODES AND RESISTORS ELECTRICALLY CONNECTED IN SERIES

CROSS-REFERENCE TO RELATED APPLICATIONS

This U.S. non-provisional patent application claims priority under 35 U.S.C. §119 of Korean Patent Application No. 10-2009-0030006, filed on Apr. 7, 2009 the entire contents of which are hereby incorporated by reference.

BACKGROUND

The present inventive concept relates to semiconductor devices and methods of fabricating the same, and more particularly, to semiconductor devices having diodes and methods of fabricating the same.

In general, a non-volatile memory device is a device that can electrically erase and program data, and can retain data even if power is not supplied. Applications for non-volatile memory are increasing in various fields.

The non-volatile memory device has various types of memory cell transistors, and can be classified into NAND type and NOR type devices, depending on the structure of a cell array in the device. The NAND type non-volatile memory device and the NOR type non-volatile memory device have the merits of high-density integration and high-speed operation.

The NAND type non-volatile memory device has the advantage of high-density integration, because the NAND type non-volatile memory device has cell strings in which a plurality of memory cell transistors are connected in series. The NAND type non-volatile memory device can update data more quickly than the NOR type non-volatile memory device, because the NAND type non-volatile memory device can simultaneously change data that are stored in memory cells. Thus, the NAND type non-volatile memory device is used for a portable device demanding mass storage, such as a digital camera or an MP3 player.

Recently, NAND type non-volatile memory devices of a three-dimensional structure have been developed.

SUMMARY

The present inventive concept provides non-volatile memory devices and methods including a diode restrained parasitic bipolar behavior which can be fabricated at a low temperature.

According to one aspect, the inventive concept is directed to a non-volatile memory device including: a substrate including a circuit device and a metal line electrically connected with the circuit device; a diode connected with the metal line in a vertical direction with respect to a surface of the substrate, and including a metal layer disposed on a lower part of the diode facing the surface of the substrate; and a resistor electrically connected with the diode in series.

In some embodiments, the diode is formed of mono-crystalline silicon.

In some embodiments, the resistor includes a phase changeable material layer or a mono-polar resistor.

In some embodiments, the resistor is disposed over or under the diode in the vertical direction.

In some embodiments, the resistor is a via pattern.

In some embodiments, the device further includes an additional diode connected with another metal line electrically connected with another circuit device in the vertical direction and disposed at a position higher than that of the diode; and an additional resistor electrically connected with the second diode in series. The additional diode includes a metal layer on a lower part of the additional diode facing the surface of the substrate.

In some embodiments, the additional resistor is disposed over or under the additional diode in the vertical direction.

According to another aspect, the inventive concept is directed to non-volatile memory devices including: a substrate including circuit devices and metal lines connected with each of the circuit devices; a first diode connected with one of the metal lines in a vertical direction with respect to a surface of the substrate; a first resistor electrically connected with the first diode in series; a second diode connected with another metal line in a vertical direction with respect to the surface of the substrate, and disposed at a position higher than that of the first diode; and a second resistor electrically connected with the second diode in series, wherein the first diode includes a metal layer on a lower part of the first diode facing the substrate, and the second diode includes a metal layer on a lower part of the second diode facing the substrate.

In some embodiments, the first and the second diodes are formed of mono-crystalline silicon.

In some embodiments, each of the first and the second resistors includes phase changeable material or a mono-polar resistor.

In some embodiments, the first resistor is disposed over or under the first diode in the vertical direction.

In some embodiments, the second resistor is disposed over or under the second diode in the vertical direction.

According to another aspect, the inventive concept is directed to a method of fabricating a non-volatile memory device including: preparing a first substrate including a circuit device and a metal line electrically connected with the circuit device; preparing a second substrate including a diode layer and a metal layer; stacking the second substrate on the first substrate by bonding, such that the metal layer of the second substrate is electrically connected with the metal line; patterning the second substrate to form a diode and a first metal pattern, the first metal pattern being electrically connected with the metal line; and forming a resistor electrically connected with the diode in series.

According to another aspect, the inventive concept is directed to a method of fabricating a non-volatile memory device including: forming a resistor on a first substrate including a circuit device and a metal line electrically connected with the circuit device, the resistor being electrically connected with the metal line; preparing a second substrate including a diode layer and a metal layer; stacking the second substrate on the first substrate including the resistor by bonding; and patterning the second substrate to form a diode and a metal pattern, the metal pattern being electrically connected with the resistor in series.

According to another aspect, the inventive concept is directed to a method of fabricating a non-volatile memory device including: preparing a first substrate including a circuit device and a metal line electrically connected with the circuit devices; preparing a second substrate including a diode layer and a metal layer; stacking the second substrate on the first substrate by bonding, such that the metal layer of the second substrate is electrically connected with the metal lines; patterning the second substrate to form a first diode and a first metal pattern, the first metal pattern being electrically connected with the metal line; forming a first resistor electrically connected with the first diode in series; preparing a third substrate having the same structure as the second substrate; stacking the third substrate by bonding, a metal layer of the third substrate being electrically connected with another metal line of the first substrate; patterning the third substrate to form a second diode and a second metal pattern, the second metal pattern being electrically connected with another metal line; and forming a second resistor electrically connected with the second diode in series.

In some embodiments, the first and second diodes include mono-crystalline silicon.

In some embodiments, each of the first and second resistors includes phase changeable material or a mono-polar resistor.

According to another aspect, the inventive concept is directed to a method of fabricating a non-volatile memory device including: preparing a first substrate including circuit devices and metal lines electrically connected with each of the circuit devices; forming a first resistor electrically connected with one of the metal lines; preparing a second substrate including a diode layer and a metal layer; stacking the second substrate on the first substrate including the first resistor by bonding; patterning the second substrate to form a first diode and a first metal pattern, the first metal pattern being electrically connected with the first resistor in series; forming a second resistor electrically connected with another metal line; preparing a third substrate having the same structure as the second substrate; stacking the third substrate by bonding; and patterning the third substrate to form a second diode and a second metal pattern, the second metal pattern being electrically connected with the second resistor in series.

In some embodiments, the first and second diodes comprise mono-crystalline silicon.

In some embodiments, each of the first and second resistors includes phase changeable material or a mono-polar resistor.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

FIGS. 8A through 8E are schematic cross-sectional views illustrating a method of fabricating a non-volatile memory device according to another embodiment of the present inventive concept.

DETAILED DESCRIPTION OF THE EMBODIMENTS

Figure 1:
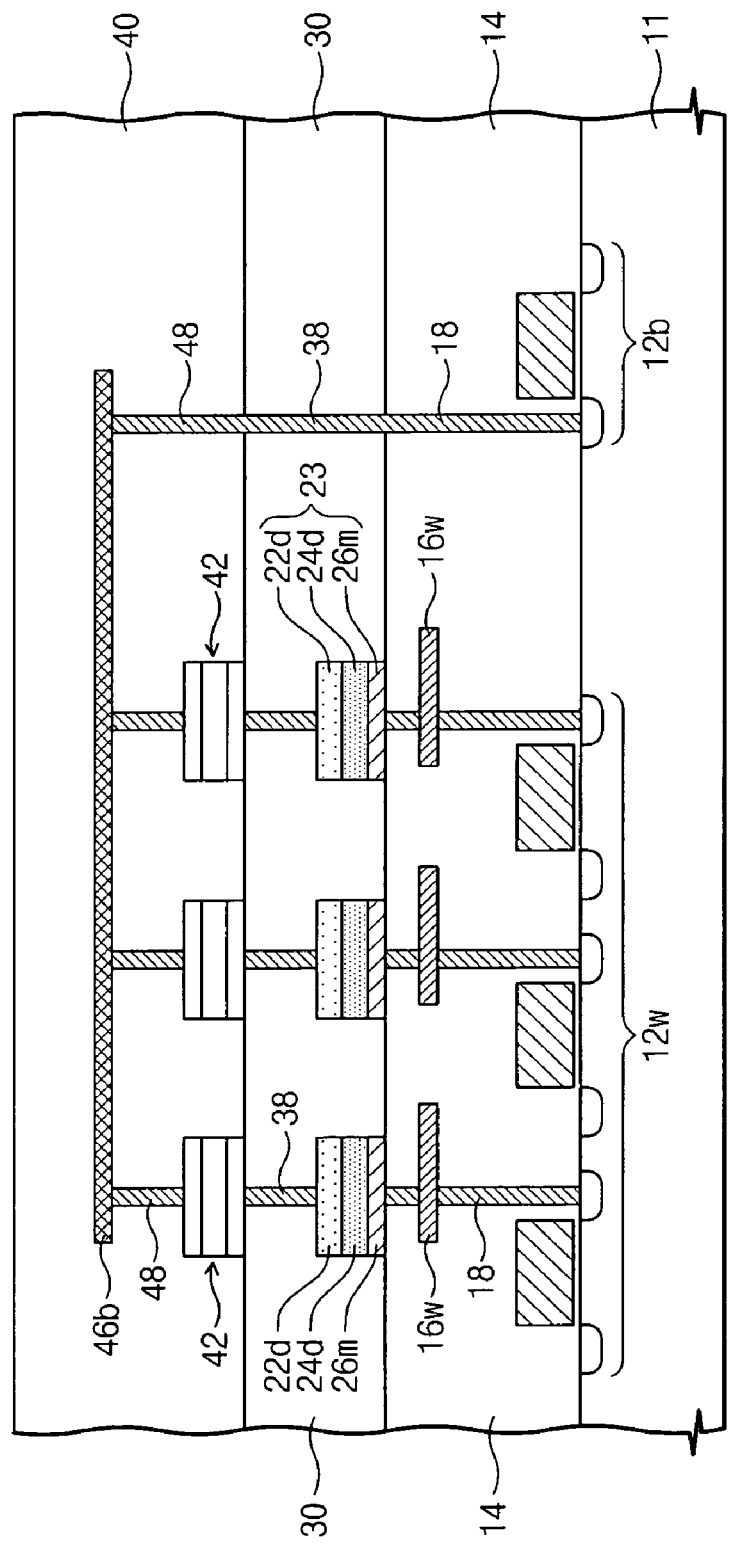
FIG. 1 is a schematic cross-sectional view illustrating a non-volatile memory device according to an embodiment of the present inventive concept.

Exemplary embodiments of the inventive concept will be described below in more detail with reference to the accompanying drawings. Advantages and features of the inventive concept and implementation methods thereof will be clarified through the description of the various embodiments with reference to the accompanying drawings. The inventive concept may, however, be embodied in different forms and should not be construed as limited to the embodiments set forth herein. Rather, these embodiments are provided so that this description will be thorough and complete, and will fully convey the scope of the inventive concept to those skilled in the art. Further, the inventive concept is only defined by scopes of claims. Like reference numerals refer to like elements throughout.

In the following description, the technical terms are used only to describe a specific exemplary embodiment while not limiting the present inventive concept. The terms of a singular form may include plural forms unless referenced to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Also, since preferred embodiments are provided below, the order of the reference numerals given in the description is not limited thereto. It will be understood that when an element such as a layer, film, region, or substrate is referred to as being "on" another element, it can be directly on the other element or intervening elements may also be present.

Additionally, the embodiment in the detailed description will be described with sectional views as ideal exemplary views of the present inventive concept. In the figures, the dimensions of layers and regions are exaggerated for clarity of illustration. Accordingly, shapes of the exemplary views may be modified according to manufacturing techniques and/or allowable errors. Therefore, the embodiments of the present inventive concept are not limited to the specific shapes illustrated in the exemplary views, but may include other shapes that may be created according to manufacturing processes. For example, an etching region illustrated in a right angle shape may have a rounded shape or a shape having a predetermined curvature. Areas exemplified in the drawings have general properties, and are used to illustrate a specific shape of a semiconductor package region. Thus, this should not be construed as limiting of the scope of the present inventive concept.

Hereinafter, exemplary embodiments of the inventive concept will be described in detail with reference to the accompanying drawings.

FIG. 1 is a schematic cross-sectional view illustrating a non-volatile memory device according to an embodiment of the present inventive concept.

Referring to FIG. 1, a non-volatile memory device may include a substrate 11, diodes 23, resistors 42 and a bit line 46b. The substrate 11 includes circuit devices 12b and 12w that include word line selection devices 12w and a bit line selection device 12b. The word line selection devices 12w and the bit line selection device 12b may be transistors. The diode 23 is connected electrically to the word line selection device 12w, each of the resistors 42 is electrically connected with each of the diodes 23 in series, and the bit line 46b connects the resistor 42 and the bit line selection device 12b.

A first insulating layer 14 may cover the substrate 11 having circuit devices 12b and 12w. First metal lines 18 are disposed in the first insulating layer 14 to be connected with impurity regions of the circuit devices 12b and 12w. Word lines 16w are disposed in the first insulating layer 14. The word line 16w is electrically connected with the first metal line 18 in series that is electrically connected with the diode 23.

Although one bit line selection device 12b and a plurality of word line selection devices 12w are shown in the FIG. 1, a plurality of bit line selection devices 12b and a plurality of word line selection devices 12w may be disposed on the substrate 11. The first metal line 18 may have more complicated structure, and the word lines 16w may be disposed over the substrate 11 and may be connected on some place of the substrate 11.

The first metal line 18 may be connected electrically to the diode 23 in a vertical direction from the substrate 11. Thus, the diode 23 can be connected with the word line selection device 12w. The diode 23 may be formed in vertical diode structure, and be formed of mono-crystalline silicon. The diode 23 may include layers having conductivity types different from each other. The diode 23 may be a unidirectional diode including a p-type layer 22d and an n-type layer 24d. Alternatively, the diode 23 may include an n-type layer 24d and a p-type layer 24d.

The diode 23 may further include a metal layer 26m on the lower part of the diode 23 facing a surface of the substrate 11. The metal layer 26m may be connected electrically to the word line 16w, thereby restraining parasitic bipolar behavior.

A second insulating layer 30 may cover the diodes 23. Second metal lines 38 electrically connected with the diodes 23 are disposed in the second insulating layer 30.

The resistors 42 are electrically connected with the second metal lines 38. Thus, the resistors 42 can be respectively connected with the diodes 23 in series. The resistor 42 may include phase changeable material or a unipolar resistor. The resistor 42 may be formed as a three layered structure including a lower electrode/a phase changeable material layer or a unipolar resistor/an upper electrode, or formed as a two layered structure including a phase changeable material layer or a unipolar resistor/an upper electrode.

A third insulating layer 40 may cover the resistors 42, and third metal lines 48 electrically connected with the resistors 42 may be disposed in the third insulating layer 40. A bit line 46b is disposed in the third insulating layer 40 to connect electrically the third metal lines 48.

The bit line 46b may be connected with the bit line selection device 12b at the substrate 11. The bit line selection device 12b is electrically connected with the bit line 46b through the first metal line 18, the second metal line 38 and the third metal line 48. The first metal line 18, the second metal line 38 and the third metal line 48 may be formed at once. Alternatively, the first metal line 18, the second metal line 38 and the third metal line 48 may be formed by respectively separated processes.

Accordingly, a cell array including diodes 23 and resistors 42 can be provided.

Figure 2:
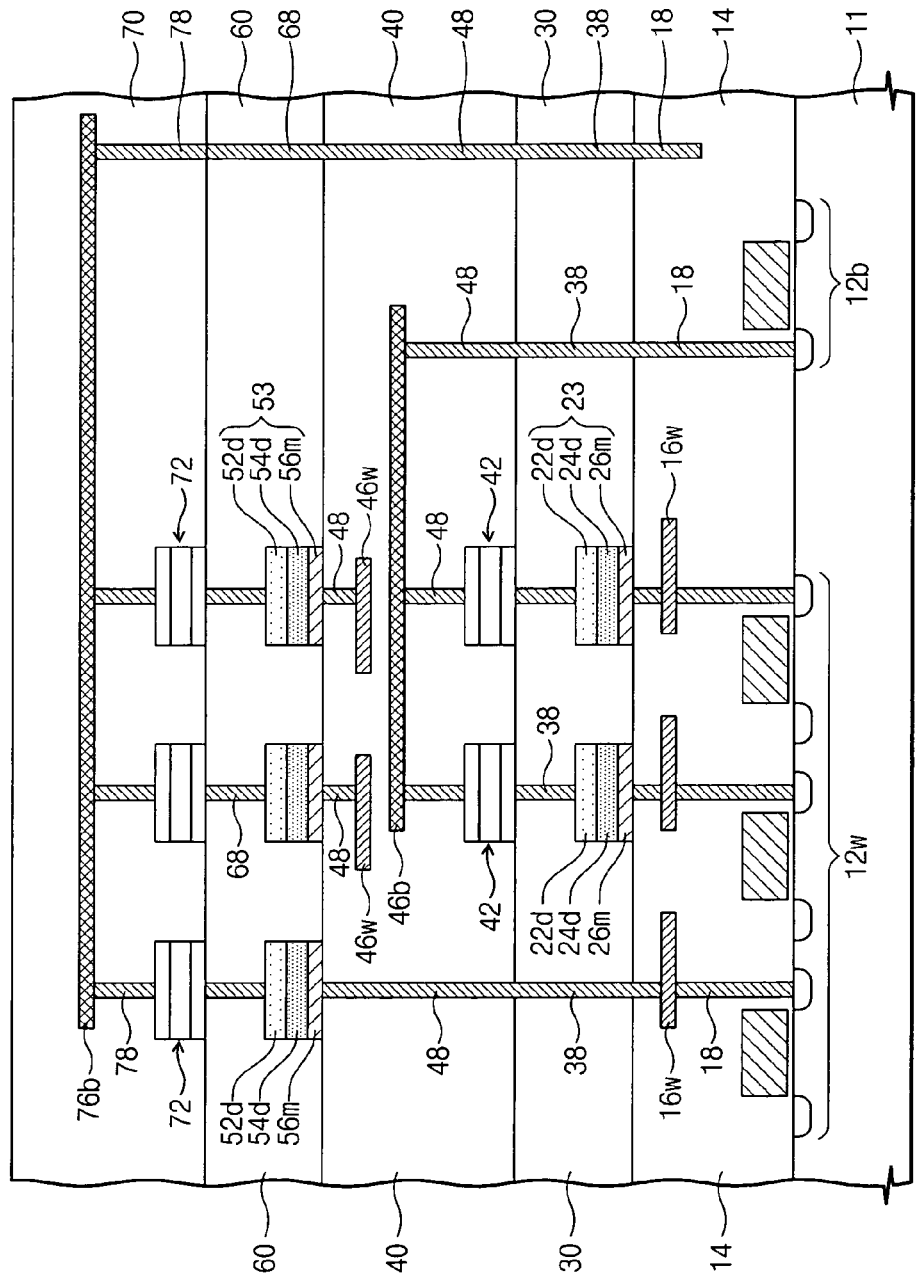
FIG. 2 is a schematic cross-sectional view illustrating a stack-type non-volatile memory device according to an embodiment of the present inventive concept.

FIG. 2 is a schematic cross-sectional view illustrating a stack-type non-volatile memory device according to an embodiment of the present inventive concept.

Referring to FIG. 2, a stack-type non-volatile memory device may include a substrate 11. The substrate includes circuit devices 12b and 12w that may include word line selection devices 12w and bit line selection devices 12b. The circuit devices 12b and 12w may be transistors. The stack-type non-volatile memory device may also include first diodes 23 electrically connected with the word line selection devices 12w, first resistors 42 connected electrically with the first diodes 23, a first bit line 46b connecting one of the first resistors 42 and one of the bit line selection devices 12b, second diodes 53 electrically connected with word line selection devices 12w that are not connected with the first diodes 23, second resistors 72 electrically connected with the second diodes 53, and a second bit line 76b electrically connecting one of the second resistors 72 and another bit line selection device 12b. The first resistor 42 is connected with the first diode 23 in series, and the second resistor 72 is connected with the second diode 53 in series.

A first insulating layer 14 may cover the substrate 11 that include the circuit devices 12b and 12w. First metal lines 18 may be disposed in the first insulating layer 14 to be connected electrically with impurity regions of the circuit devices 12b and 12w. First word lines 16w may be disposed in the first insulating layer 14 to be respectively connected with the first metal lines 18 that are respectively connected with the first diodes 23 and the second diodes 53.

Although a plurality of the word line selection devices 12w and the bit line selection device 12b are shown in FIG. 2, a plurality of the word line selection devices 12w and a plurality of the bit line selection devices 12b may be disposed at the substrate 11. The first metal lines 18 are shown as contact plugs, however, the first metal lines 18 may have more complex structures. The first word line 16w may be disposed over the substrate 11, and thereby a plurality of diodes in the same layer may be connected with the word line.

The first diodes 23 are electrically connected with parts of the first metal lines 18 in a vertical direction with respect to the substrate 11. The first diodes 23 are electrically connected with the word line selection devices 12w, respectively. The first diode 23 may be formed in vertical diode structure and be formed of mono-crystalline silicon. The first diode 23 includes layers having conductivity types different from each other. The first diode 23 may be a unidirectional diode that includes an n-type layer 24d and a p-type layer 22d, or an n-type layer 22d and a p-type layer 24d.

A first metal layer 26m may be formed on a lower part of the first diode 23 facing a surface of the substrate 11. The first metal layer 26m may be connected with the first word line 16w, and thereby parasitic bipolar behavior can be basically restrained.

A second insulating layer 30 may cover the first diodes 23. Second metal lines 30 are disposed in the second insulating layer 30. The second metal lines 30 are connected with the first diodes 23, or the first metal line 18 in the first insulating layer 14.

First resistors 42 are electrically connected with second metal lines 38 that are connected with the first diodes 23. The first resistor 42 is electrically connected with the first diode 23 in series. The first resistor 42 may include a phase changeable material layer or a unipolar resistor. The first resistor 42 is formed in a three layered structure including a lower electrode/a phase changeable material layer or a unipolar resistor/an upper electrode, or formed in two layered structure including a phase changeable material layer or a unipolar resistor/an upper electrode.

A third insulating layer 40 covers the first resistors 42. Third metal lines 48 are disposed in the third insulating layer 40 to be electrically connected with the second metal line 38 and the first resistors 42. A first bit line 46b is further disposed in the third insulating layer 40.

The first bit line 46 is electrically connected with the bit line selection device 12b. The bit line 46b and the bit line selection device 12b are electrically connected through the first, the second and the third metal lines 18, 38 and 48. The first, the second and the third metal lines 18, 38 and 48 are formed by respective separate processes, or formed at once.

The second diodes 53 are respectively connected with the first metal lines 18 in a vertical direction with respect to the substrate 11. The second diodes 53 are electrically connected with other first metal line 18 that are not connected with the first diodes 23. Thus, the second diodes 53 are electrically connected with other word line selection devices 12w that are not connected with first diodes 23. The second diode 53 may be formed in a vertical diode structure. The second diode 53 is formed of mono-crystalline silicon. The second diode 53 may be a unidirectional diode including layers having conductivity types different from each other. The second diode 53 consists of an n-type layer 54d and a p-type layer 52d, or a p-type layer 52d and an n-type layer 54d.

A second metal layer 56m is disposed on a lower part of the second diode 53 facing the surface of the substrate 11. The second metal layer 56m is electrically connected with the first word line 16w or the second word line 46w, and thereby parasitic bipolar behavior can be restrained.

A fourth insulating layer 60 covers the second diodes 53. Fourth metal lines 68 are disposed in the fourth insulating layer 60.

The second resistor 72 may be connected with the fourth metal line 68 to be electrically connected with the second diode 53 in series. The second resistor 72 may include a phase changeable material layer or a unipolar resistor. The second resistor 72 may be formed in three layered structure including a lower electrode/a phase changeable material layer or a unipolar resistor/an upper electrode, or two layered structure including a phase changeable material layer or a unipolar resistor/an upper electrode.

A fifth insulating layer 70 covers the second resistors 72. Fifth metal lines 78 are disposed in the fifth insulating layer 70 to be connected with the second resistors 72. A second bit line 76b is disposed in the fifth insulating layer 70 to connect electrically the fifth metal lines 78.

The second bit line 76b may be electrically connected with another bit line selection device 12b that is not connected with the first bit line 46b. The second bit line 76b may be connected with the bit line selection device 12b through the first, the second, the third, the fourth and the fifth metal lines 18, 38, 48, 68 and 78. The first, the second, the third, the fourth and the fifth metal lines 18, 38, 48, 68 and 78 that connect the second bit line 76b and the bit line selection device 12b are formed by respectively separated process or formed at once.

Accordingly, a first cell array including first diodes 23 and first resistors 42 and a second cell array including second diodes 53 and second resistors 72 can be stacked on a substrate 11.

Figure 3:
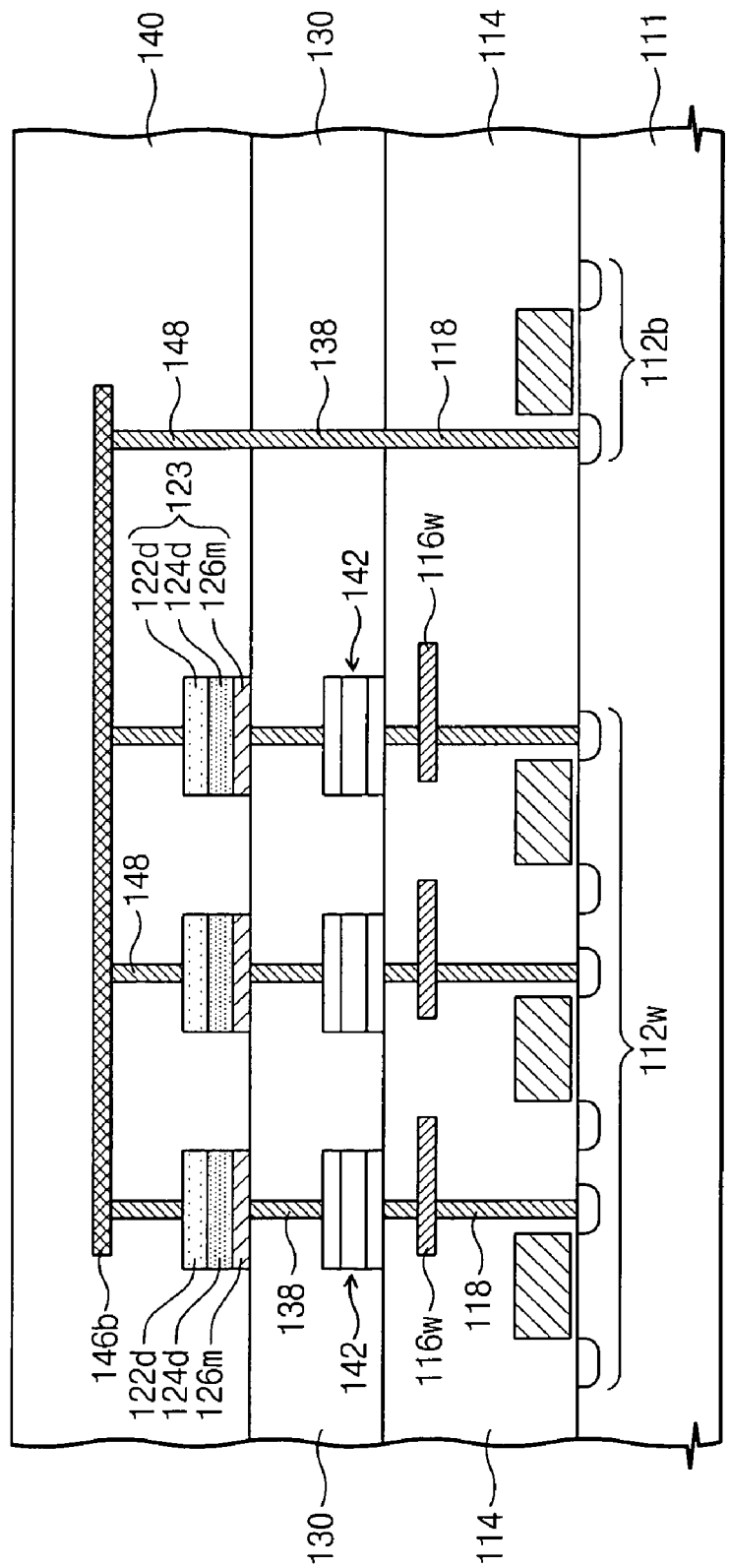
FIG. 3 is a schematic cross-sectional view illustrating a non-volatile memory device according to another embodiment of the present inventive concept.

FIG. 3 is a schematic cross-sectional view illustrating a non-volatile memory device according to another embodiment of the present inventive concept.

Referring to FIG. 3, a non-volatile memory device may include a substrate 111, diodes 123, resistors 142 and a bit line 146b. The substrate 111 includes circuit devices 112b and 112w that include word line selection devices 112w and a bit line selection device 112b. The word line selection devices 112w and the bit line selection device 112b may be transistors. The resistor 142 is connected electrically to the word line selection device 112w, the diode 123 is connected electrically to the resistor 142 in series, and the bit line 146b connects the diode 123 and the bit line selection device 112b.

A first insulating layer 114 may cover the substrate 111 having circuit devices 112b and 112w. First metal lines 118 are disposed in the first insulating layer 114 to be connected with impurity regions of the circuit devices 112b and 112w. Word lines 116w are disposed in the first insulating layer 114. The word line 116w is electrically connected with the first metal line 118 that is connected electrically to the resistor 142.

Although one bit line selection device 112b and a plurality of word line selection devices 112w are shown in the FIG. 3, there can be a plurality of bit line selection devices 112b and a plurality of word line selection devices 112w on the substrate 111. The first metal lines 118 are shown as contact plugs, however, the first metal line 118 may have a more complex structure. Also, the word lines 116w may be disposed over the substrate 111 and may be connected at some point of the substrate 111.

The first metal line 118 may be connected electrically to the resistor 142, and thereby the resistor 142 can be connected with the word line selection device 112w. The resistor 142 may be formed in a three layered structure including a lower electrode/a phase changeable material layer or a unipolar resistor/an upper electrode, or formed in a two layered structure including a phase changeable material layer or a unipolar resistor/an upper electrode.

A second insulating layer 130 may cover the resistor 142. Second metal lines 138 are disposed in the second insulating layer 30 to be electrically connected with the resistors 142.

The diode 123 may be connected with the second metal line 138 in a vertical direction with respect to the substrate 111, and thus the diode 123 can be connected with the resistor 142. The diode 123 may be formed in a vertical diode structure, and formed of mono-crystalline silicon. The diode 123 may include layers having conductivity types different from each other. The diode 123 may be a unidirectional diode that includes a p-type layer 122d and an n-type layer 124d. Alternatively, the diode 123 may include an n-type layer 122d and a p-type layer 124d.

The diode 123 may further include a metal layer 126m on a lower part of the diode 123 facing a surface of the substrate 111. The metal layer 126m may be connected electrically to the second metal line 138, and thereby parasitic bipolar behavior can be restrained.

A third insulating layer 140 covers the diodes 123. Third metal lines 148 are disposed in the third insulating layer 140 to be connected with the diodes 123. A bit line 146b is disposed in the third insulating layer 140 to connect the third metal lines 148.

The bit line 146b may be connected with the bit line selection device 112b at the substrate 111. The bit line selection device 112b is electrically connected with the bit line 146b through the first metal line 118, the second metal line 138 and the third metal line 148. The first metal line 118, the second metal line 138 and the third metal line 148 may be formed at once. Alternatively, the first metal line 118, the second metal line 138 and the third metal line 148 may be formed by respectively separated processes.

Accordingly, a cell array including diodes 123 and resistor 142 can be provided.

Figure 4:
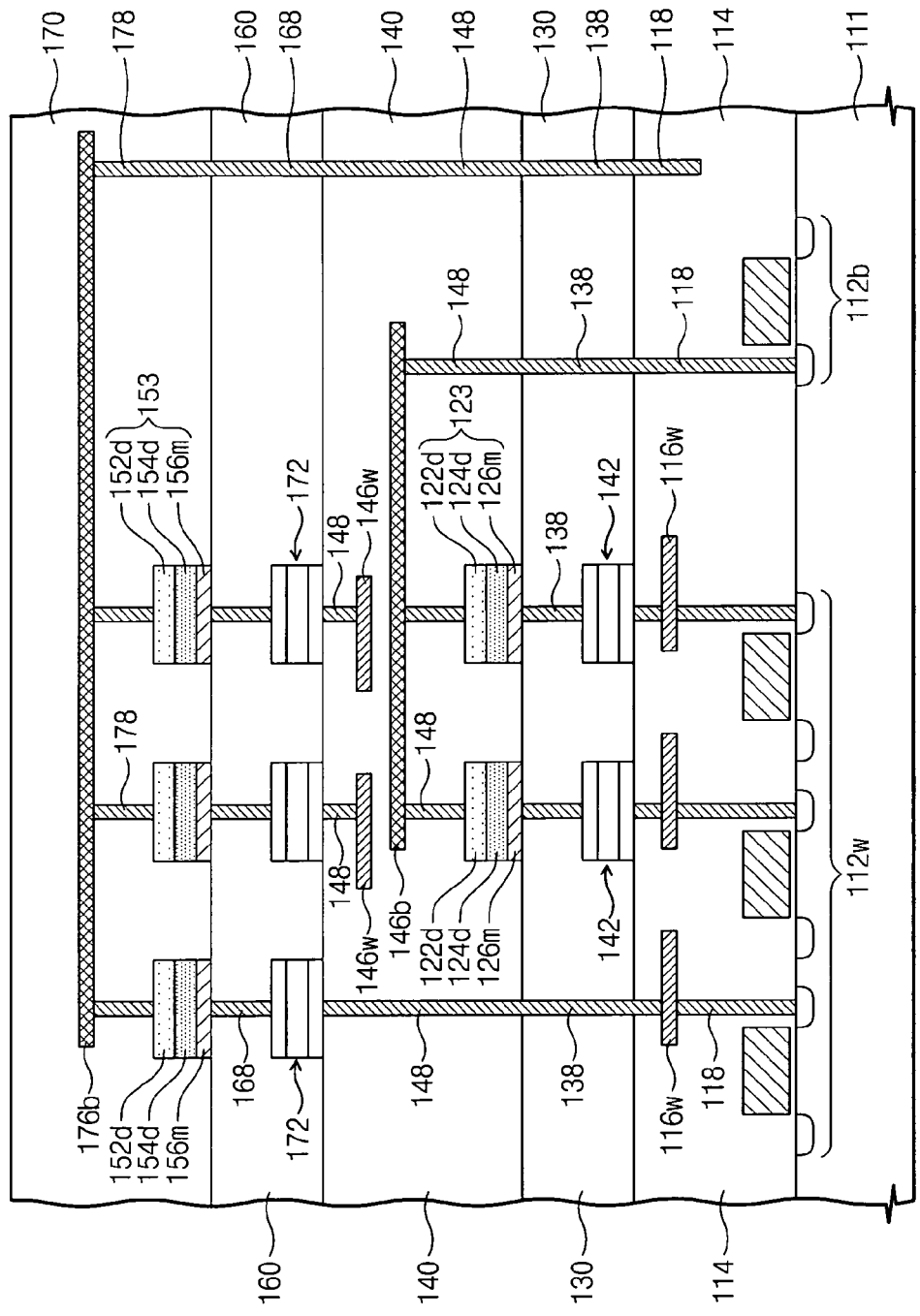
FIG. 4 is a schematic cross-sectional view illustrating a stack-type non-volatile memory device according to another embodiment of the present inventive concept.

FIG. 4 is a schematic cross-sectional view illustrating a stack-type non-volatile memory device according to another embodiment of the present inventive concept.

Referring to FIG. 4, a stack-type non-volatile memory device may include a substrate 111. The substrate 111 includes circuit devices 112b and 112w that may include word line selection devices 112w and bit line selection devices 112b. The circuit devices 112b and 112w may be transistors. The stack-type non-volatile memory device may also include first resistors 142 electrically connected with parts of the word line selection devices 112w, first diodes 123 connected electrically with the first resistors 142, a first bit line 146b connecting one of the first diodes 123 and one of the bit line selection devices 112b, second resistors 172 electrically connected with other parts of the word line selection devices 112w, second diodes 153 electrically connected with the second resistors 172, and a second bit line 176b electrically connecting one of the second diodes 153 and another bit line selection device 112b. The first diode 123 is connected with the first resistor 142 in series, and the second diode 153 is connected with the second resistor 172 in series.

A first insulating layer 114 may cover the substrate 111 that includes the circuit devices 112b and 112w. First metal lines 18 may be disposed in the first insulating layer 114 to be connected electrically with impurity regions of the circuit devices 112d and 112w. First word lines 116w may be disposed in the first insulating layer 114 to be respectively connected with the first metal lines 118 that are respectively connected with the first resistor 142 and the second resistor 172.

Although a plurality of the word line selection devices 112w and the bit line selection device 112b are shown in FIG. 4, a plurality of the word line selection devices 112w and a plurality of the bit line selection devices 112b can be disposed at the substrate 111. The first metal lines 118 are shown as contact plugs, however, the first metal lines 118 may have a more complex structure. The first word line 116w may be disposed over the substrate, and thereby a plurality of diodes in the same layer may be connected with the word line.

The first resistors 142 are connected electrically with parts of the first metal lines 118. The first resistor 142 may include a phase changeable material layer or a unipolar resistor. The first resistor 142 is formed in three layered structure including a lower electrode/a phase changeable material layer or a unipolar resistor/an upper electrode, or formed in two layered structure including a phase changeable material layer or a unipolar resistor/an upper electrode.

A second insulating layer 130 may cover the first resistors 142. Second metal lines 138 are disposed in the second insulating layer 130. The second metal lines 138 are connected with the first resistors 142 or the first metal line 118.

The first diodes 123 are electrically connected with the second metal lines 138 in a vertical direction from the substrate 111 and thereby the first diode 123 can be electrically connected with the first resistor 142 in series. The first diode 123 may be a vertical diode type and be formed of mono-crystalline silicon. The first diode 123 includes layers having conductivity types different from each other. The first diode 123 may be a unidirectional diode that includes n-type layer 124d and p-type layer 122d, or includes n-type layer 122d and p-type layer 124d.

The first diode 123 may include a first metal layer 126m on a lower part of the first diode 123 facing a surface of the substrate 111. The first metal layer 126m may be connected with the second metal lines 138 that are electrically connected with first diodes 123, thereby restraining parasitic bipolar behavior.

A third insulating layer 140 covers the first diodes 123. Third metal lines 148 are disposed in the third insulating layer 140 to be electrically connected with the second metal line 138 and the diodes 123. A first bit line 146b is further disposed in the third insulating layer 140 to connect the third metal lines 148.

The first bit line 146b is electrically connected with the bit line selection device 112b. The first bit line 146b and the bit line selection device 112b are electrically connected through the first, the second and the third metal lines 118, 138 and 148. The first, the second and the third metal lines 118, 138 and 148 are formed by respectively separated processes, or formed at once.

The second resistors 172 may be connected with first metal lines 118 that are not connected with the first resistors 142. The second resistors 172 are electrically connected with the first metal lines 118 through the second metal lines 138 and the third metal lines 148. Thus the second resistor 172 can be connected with a word line selection device 112w that is not connected with the first resistor 142. The second resistor 172 may include a phase changeable material layer or a unipolar resistor. The second resistor 172 may be formed in a three layered structure including a lower electrode/a phase changeable material layer or a unipolar resistor/an upper electrode, or formed in a two layered structure including a phase changeable material layer or a unipolar resistor/an upper electrode.

A fourth insulating layer 160 covers the second resistor 172. Fourth metal lines 168 are disposed in the fourth insulating layer 160 to be connected with the second resistors 172.

The second diodes 153 are connected with the fourth metal lines 168 in a vertical direction with respect to the substrate 111, and thereby the second diode 153 is electrically connected with the second resistor 172 in series. The second diode 153 may be formed in vertical diode structure. The second diode 153 may be formed of mono-crystalline silicon. The second diode 153 may be a unidirectional diode including layers having conductivity types different from each other. The second diode 153 includes an n-type layer 154d and a p-type layer 152d, or a p-type layer 152d and an n-type layer 154d.

The second diode 153 may include a second metal layer 156m on a lower part of the second diode 153 facing the surface of the substrate 111. The second metal layer 156m is electrically connected with the fourth metal lines 168 that are connected with the second diodes 153, and thereby parasitic bipolar behavior can be restrained.

A fifth insulating layer 170 covers the second diodes 153. Fifth metal lines 178 are disposed in the fifth insulating layer 170 to be connected with the second diodes 153. A second bit line 176b is disposed in the fifth insulating layer 170 to connect electrically the fifth metal lines 178.

The second bit line 176b may be electrically connected with another bit line selection device 112b that is not connected with the first bit line 146b. The second bit line 176b may be connected with the bit line selection device 112b through the first, the second, the third, the fourth and the fifth metal lines 118, 138, 148, 168 and 178. The first, the second, the third, the fourth and the fifth metal lines 118, 138, 148, 168 and 178 that connect the second bit line 176b and the bit line selection device 112b are formed by respectively separated processes or formed at once.

Accordingly, a first cell array including first diodes 123 and first resistors 142 and a second cell array including second diodes 153 and second resistors 172 can be stacked on a substrate 111.

Figure 5:
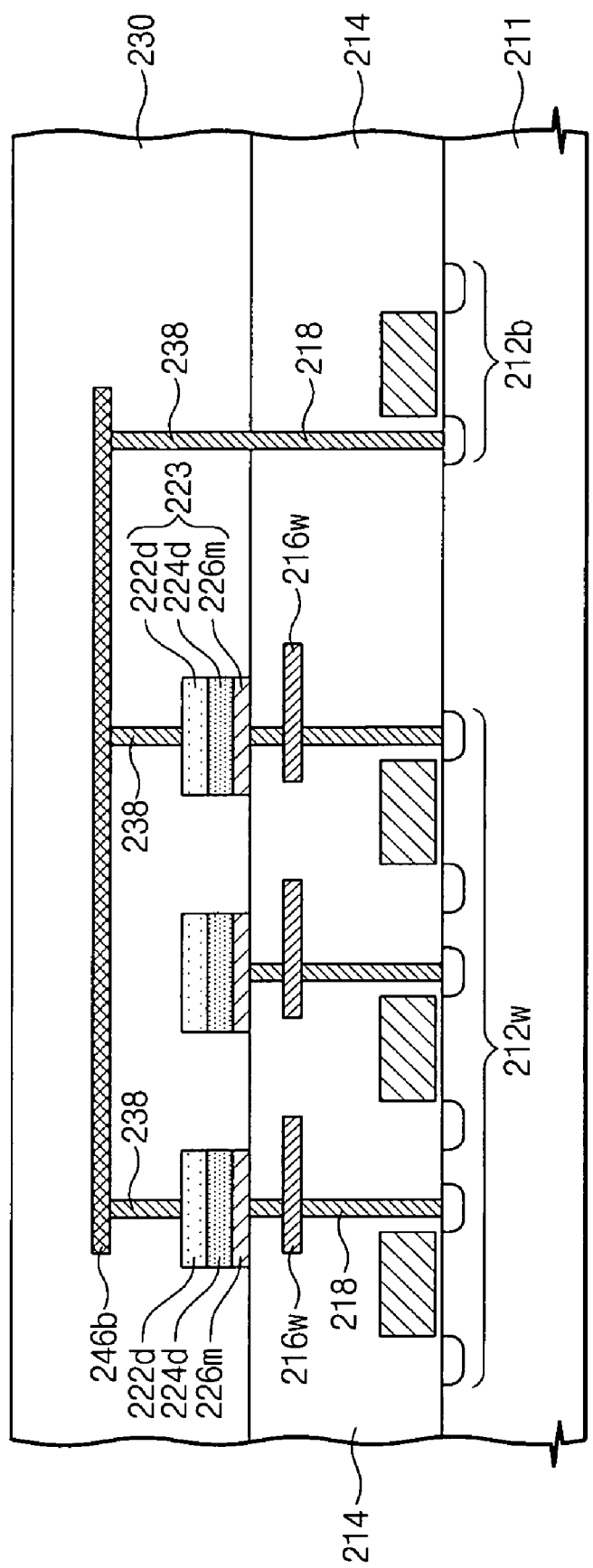
FIG. 5 is a schematic cross-sectional view illustrating a ROM device according to an embodiment of the present inventive concept.

FIG. 5 is a schematic cross-sectional view illustrating a ROM device according to embodiment of the present inventive concept.

Referring to FIG. 5, a ROM device may include a substrate 211, diodes 223 and a bit line 246b. The substrate 211 includes circuit devices 212b and 212w that include word line selection devices 212w and a bit line selection device 212b. The word line selection devices 212w and the bit line selection device 212b may be transistors. The diode 223 is connected electrically to the word line selection device 212w, the resistor 242 is connected electrically to the diode 223 in series, and the bit line 246b connects the resistor 242 and the bit line selection device 212b.

A first insulating layer 214 may cover the substrate 211 having circuit devices 212b and 212w. First metal lines 218 are disposed in the first insulating layer 214 to be connected with impurity regions of the circuit devices 212b and 212w. Word lines 216w are disposed in the first insulating layer 214. The word line 216w is electrically and serially connected with the metal line 218 that is connected electrically to the diode 223.

Although one bit line selection device 212b and a plurality of word line selection devices 212w are shown in the FIG. 5, there can be a plurality of bit line selection devices 212b and a plurality of word line selection devices 212w on the substrate 211. The first metal lines 218 are shown as contact plugs, however, the first metal lines may have a more complex structure. Also, the word lines 216w may be disposed over the substrate 211 and may be connected at some point of the substrate 211.

The first metal line 218 may be connected electrically to the diode 223 in a vertical direction from the substrate 211. Thus, the diode 223 can be connected with the word line selection device 212w. The diode 223 may be formed in vertical diode structure, and be formed of mono-crystalline silicon. The diode 223 may include layers having conductivity types different from each other. The diode 223 may be a unidirectional diode includes a p-type layer 222d and an n-type layer 224d. Alternatively, the diode may include an n-type layer 224d and a p-type layer 222d.

The diode 223 may further include a metal layer 226m on a lower part of the diode facing a surface of the substrate 211. The metal layer 226m may be connected electrically to the word line 216w and thereby parasitic bipolar behavior can be restrained.

A second insulating layer 230 may cover the diodes 223. Second metal lines 238 electrically connected with parts of the diodes 223 are disposed in the second insulating layer 230. The second metal lines 238 may have a via shape. A data state of a memory cell may be determined depending on whether the second metal line 238 is electrically connected with the diode 223. The bit line 246b is disposed in the second insulating layer 230 to connect electrically the second metal lines 238.

The bit line 246b may be connected with the bit line selection device 212b at the substrate 211. The bit line selection device 212b is electrically connected with the bit line 246b through the first metal line 218 and the second metal line 238. The first metal line 218 and the second metal line 238 may be formed by the same process. Alternatively, the first metal line 218 and the second metal line 238 may be formed by respectively separated processes.

Accordingly, via coding mask ROM cells indicating whether there is the second metal line 238 electrically connecting between the diode 223 and the bit line 246b can be provided.

FIGS. 6A through 6E are schematic cross-sectional views illustrating a method of fabricating a non-volatile memory device according to an embodiment of the present inventive concept.

Figure 6A:
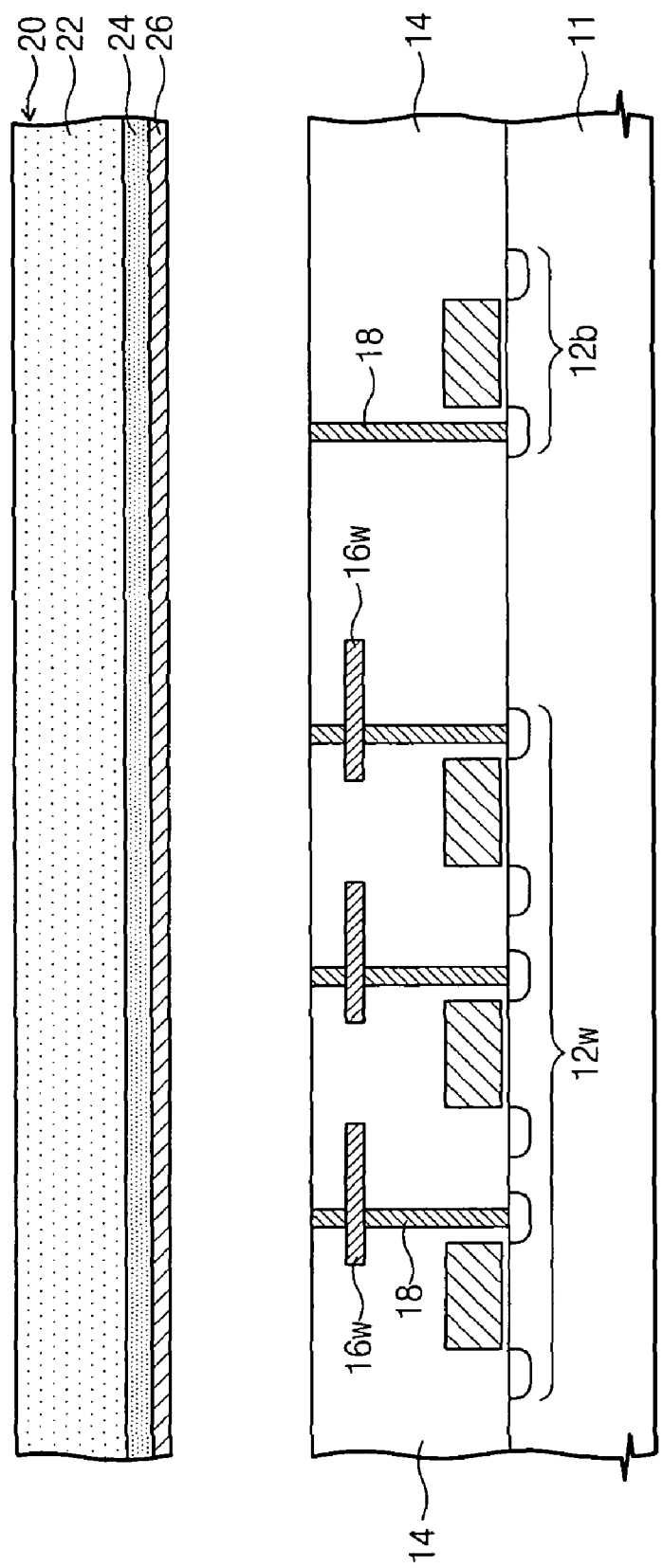
FIGS. 6A through 6E are schematic cross-sectional views illustrating a method of fabricating a non-volatile memory device according to an embodiment of the present inventive concept.

Referring to FIG. 6A, a first substrate 11 and a second substrate 20 are prepared. Circuit devices 12b and 12w are formed on the first substrate, and a first diode layer 22 and 24 and a first metal layer 26 are formed on the second substrate.

The circuit devices 12b and 12w may be transistors and include a bit line selection device 12b and a plurality of word line selection devices 12w. A first insulating layer 14 covers the first substrate 11 that includes the circuit devices 12b and 12w. First metal lines 18 are formed in the first insulating layer 14 to be electrically connected with impurity regions of the circuit devices 12b and 12w. First word lines 16w may be formed in the first insulating layer 14. The first word lines 16 are electrically connected with the first metal lines 18.

Although the circuit devices 12b and 12w are shown as a plurality of the word line selection devices 12w and one bit line selection device 12b, a plurality of the word line selection devices 12w and a plurality of the bit line selection devices 12b may be formed on the substrate 11. The first metal lines 18 may be more complicated structure than that shown in FIG. 1, and the first word lines 16w may be disposed over the substrate 11 and may be connected at some point of the substrate 11.

The second substrate 20 may be doped with impurity by using an implantation process to form a first diode layer 22 and 24 at the second substrate 20. Alternatively the first diode layer is formed by epitaxial growth. The first diode layer 22 and 24 includes an n-type layer 24 and a p-type layer 22, respectively. In contrast, the first diode layer 22 and 24 may include a p-type layer 22 and an n-type layer 24, respectively. The first diode layer 22 and 24 may have a structure of a unidirectional diode.

The first metal layer 26 may be formed on the second substrate 20 on which the first diode layer 22 and 24 are formed. The first metal layer 26 may have metallic material that is to be used for bonding.

Figure 6B:
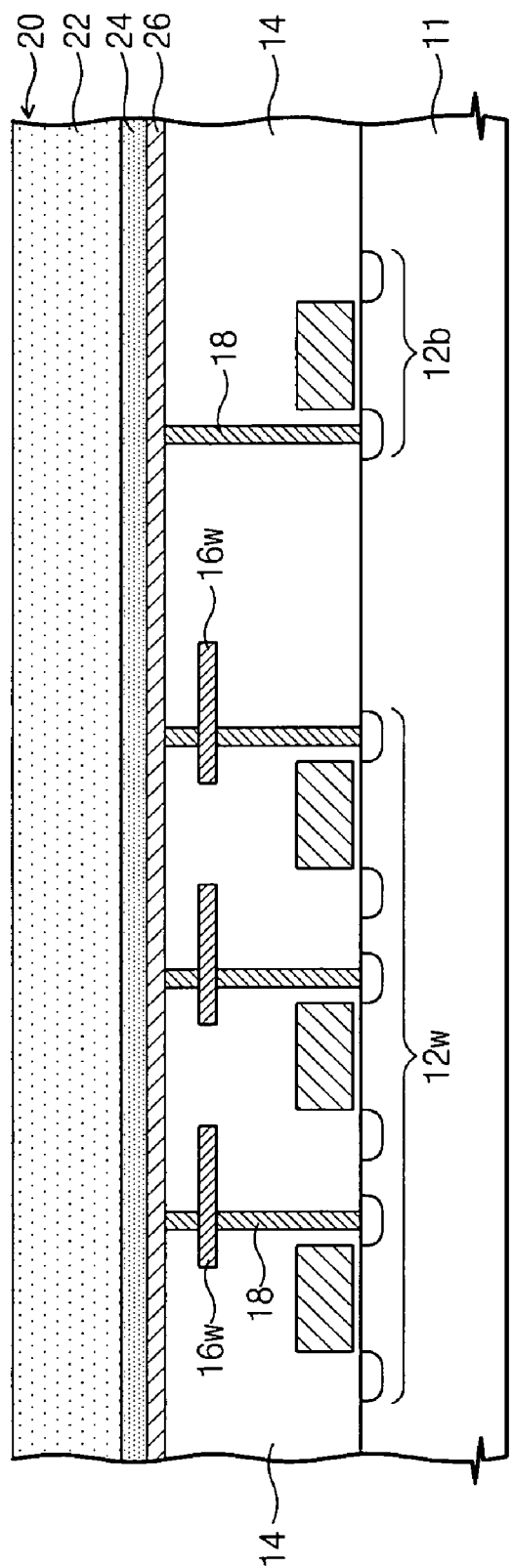
Figure 6C:
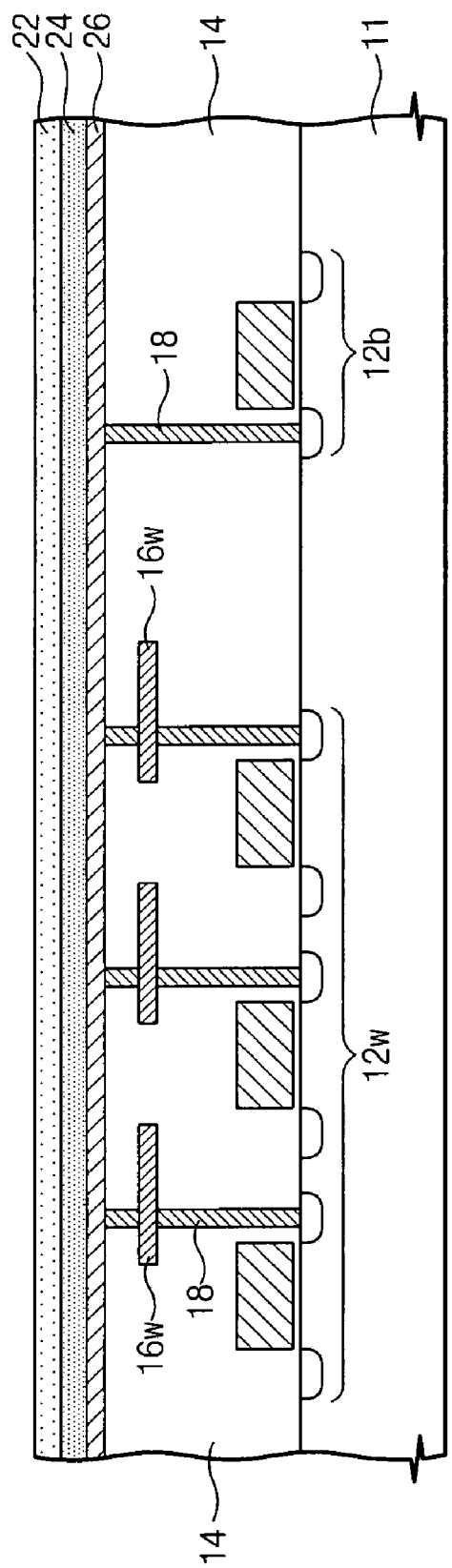

Referring to FIGS. 6B and 6C, the second substrate 20 is bonded to the first substrate 11 by the intermediate of the first metal layer 26 for connecting the first metal lines 18 of the first substrate 11 and the first metal layer 26 of the second substrate 20. Metallic material that is to be used for bonding may be formed on the first insulating layer 14 of the first substrate 11. For forming first diodes at a desired thickness, a portion of the second substrate 20 may be then polished or separated away.

Figure 6D:
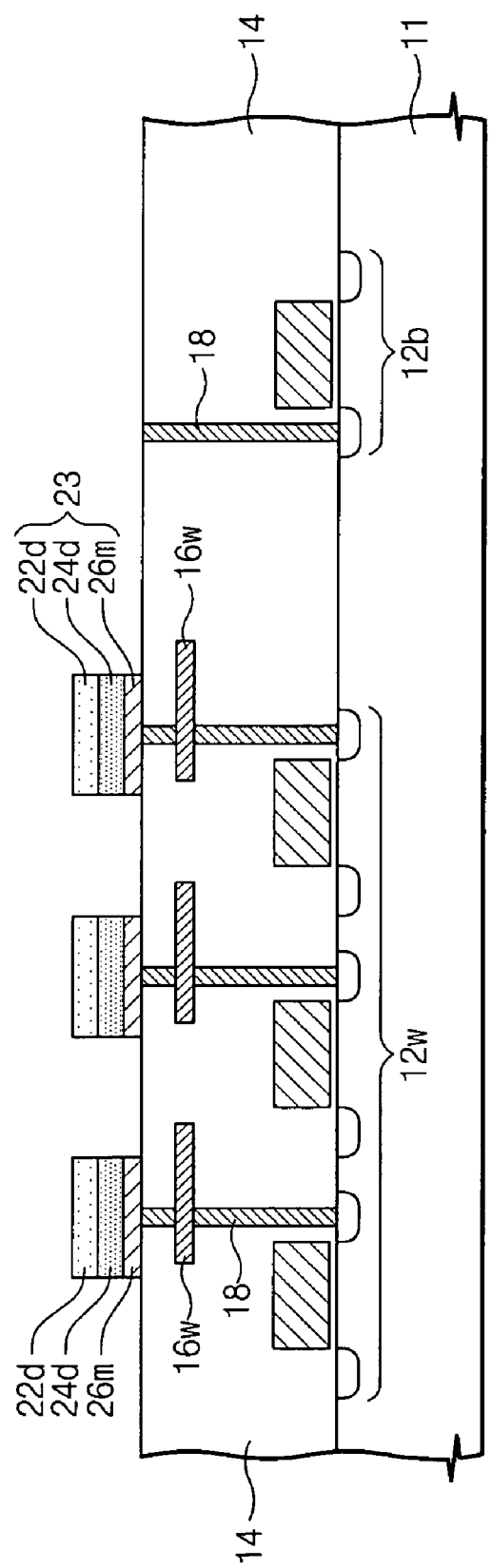

Referring to FIG. 6D, the second substrate 20 is patterned to form first diodes 23. Thus, the first diodes 23 are electrically connected with the first metal lines 18 in a vertical direction from the first substrate 11, and the first diodes 23 are electrically connected with word line selection devices 12w of the circuit devices 12b and 12w. The diode 23 may be formed of vertical structure.

The first diode 23 has a first metal pattern 26m on a lower part of the first diode 23 facing a surface of the first substrate 11. The first metal pattern 26m is electrically connected with the first word line 16w. Thus parasitic bipolar behavior can be basically restrained.

The second substrate 20 may be patterned by two different methods. The first method includes patterning the first diode layer 22 and 24 and the first metal layer 26 into a line shape. The first diode layer 22 and 24 of a line shape is then patterned to form a plurality of the first diodes 23 on the first metal pattern 26m of a line shape. The second method includes patterning the first diode layer 22 and 24 and the first metal layer 26 at once, thereby forming the first diodes 23 and the first metal patterns 26m. The first diode 23 and the first metal pattern 26m are then electrically insulated from adjacent first diode 23 and first metal pattern 26m.

Figure 6E:
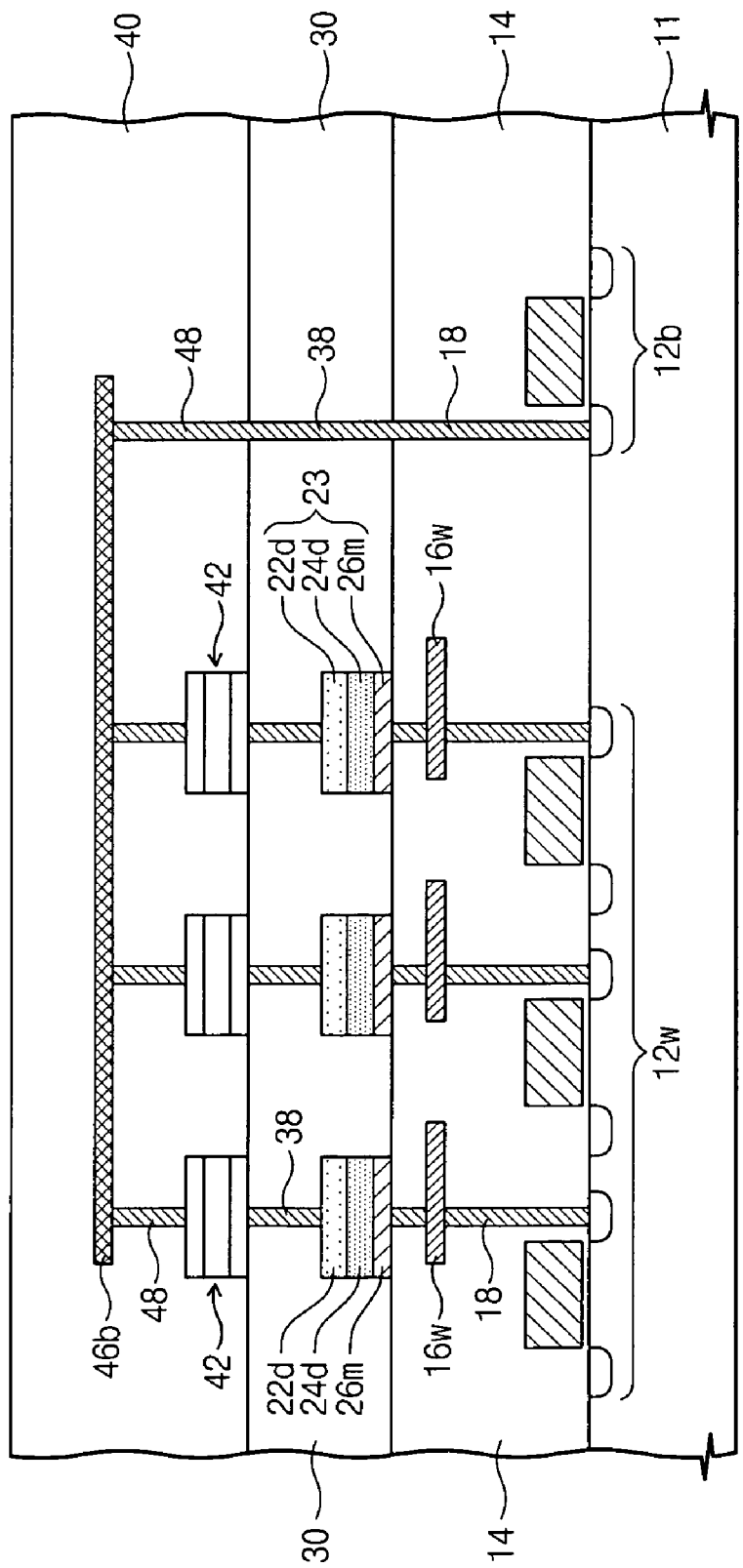

Referring to FIG. 6E, a second insulating layer 30 covers the first diodes 23. Second metal lines 38 are formed in the second insulating layer 30 to be electrically connected with first diodes 23.

First resistors 42 are formed to be electrically connected with the first diodes 23. The first resistor 42 is electrically connected with the second metal line 38. Thus, the first resistor 42 can be connected with the first diode 23 in series.

The first resistor 42 may include a phase changeable material layer or a unipolar resistor. The first resistor 42 may have a three layered structure of a lower electrode/a phase changeable material layer or a unipolar resistor/an upper electrode, or a two layered structure of a phase changeable material layer or a unipolar resistor/an upper electrode.

A third insulating layer 40 covers the first resistors 42. Third metal lines 48 are formed in the third insulating layer 40 to be connected with the first resistors 42. A first bit line 46b is also formed in the third insulating layer 40.

The first bit line 46b is electrically connected with the bit line selection device 12b that is formed at the first substrate 11. The first bit line 46b is electrically connected with the bit line selection device 12b through the first, the second and the third metal lines 18, 38 and 48 which are sequentially connected. The first metal line 18, the second metal line 38 and the third metal line 48 may be formed by respective separated processes. Alternately the first metal line 18, the second metal line 38 and the third metal line 48 may be formed at once.

Therefore, a non-volatile memory device that includes a cell array having the first diodes 23 and the first resistors 42 are fabricated.

Figure 7A:
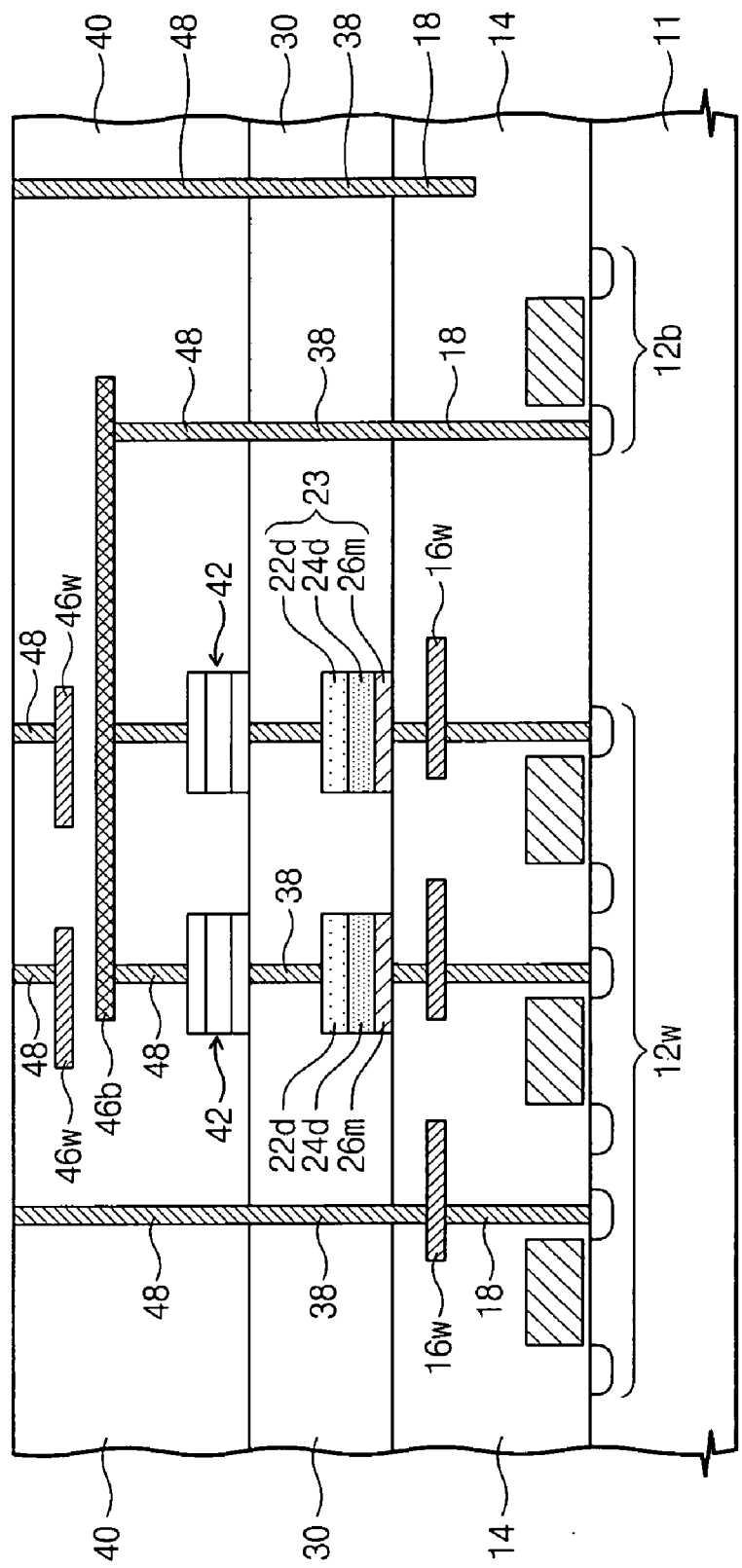
FIGS. 7A through 7C are schematic cross-sectional views illustrating a method of fabricating a stack-type non-volatile memory device according to an embodiment of the present inventive concept.
Figure 7B:
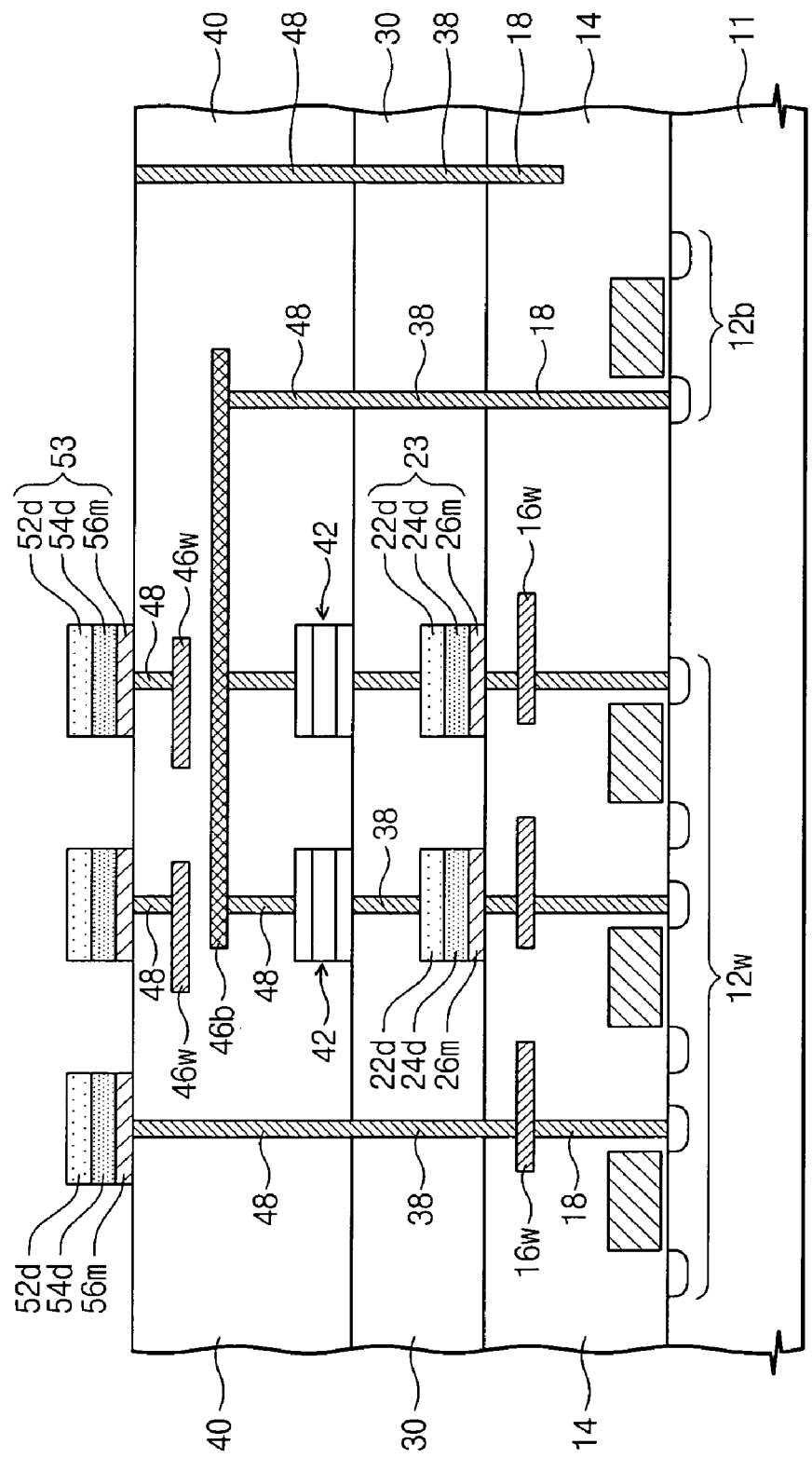
Figure 7C:
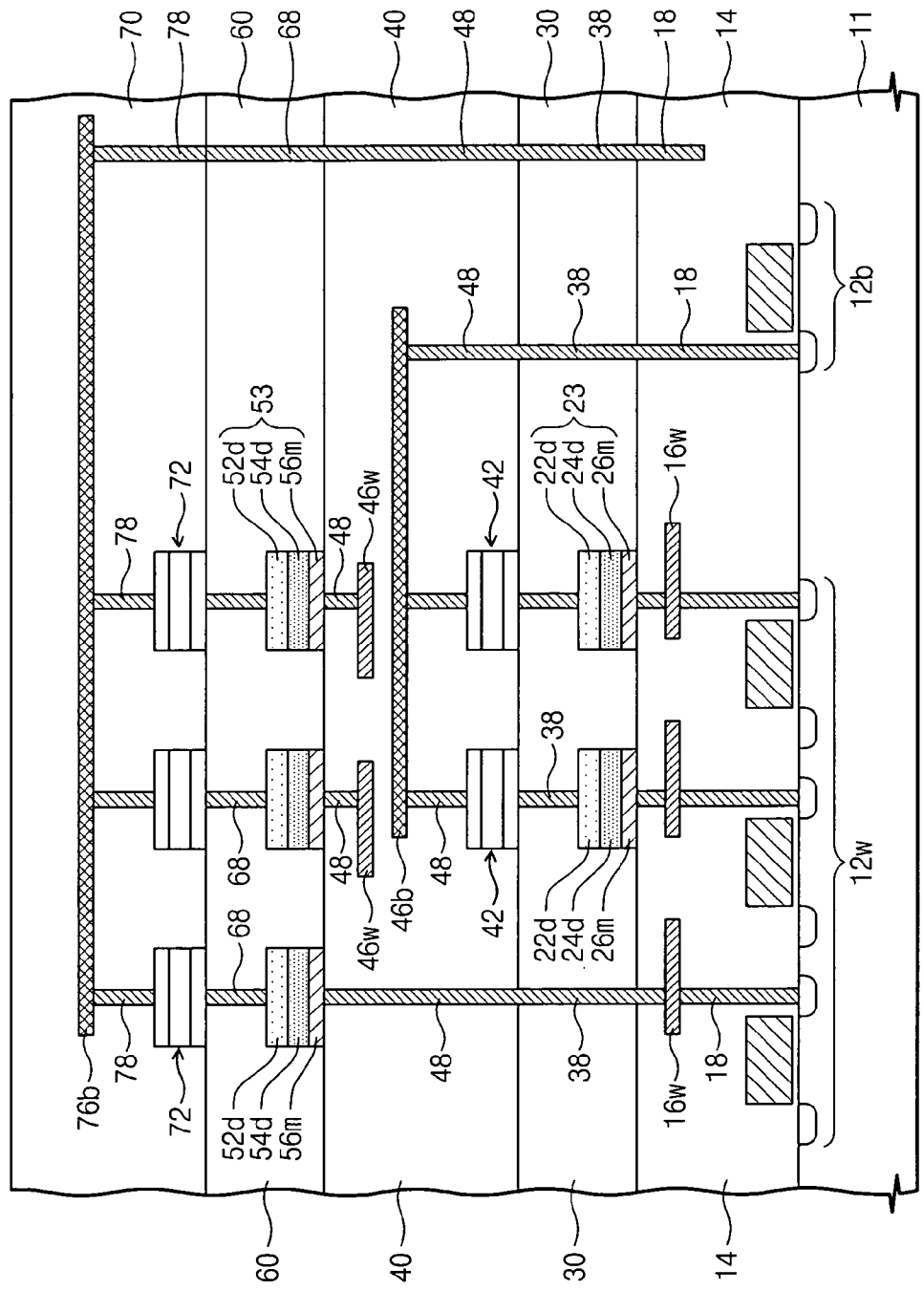

FIGS. 7A through 7C are schematic cross-sectional views illustrating a method of fabricating a stack-type non-volatile memory device according to an embodiment of the present inventive concept. According to the embodiment of FIGS. 7A through 7C, a second cell array may be formed on the resultant structure of the FIG. 6E.

Referring to FIGS. 7A and 7B, a third substrate including a second diode layer and a second metal layer is prepared. The third substrate has the same structure as the second substrate 20 described above.

The second diode layer may be formed by implanting different impurities into the third substrate of mono-crystalline silicon. The second diode layer may also be formed by epitaxial growth. The second diode layer includes an n-type layer and a p-type layer. The n-type layer and the p-type layer can be exchanged in position.

A second metal layer may be formed on the third substrate on which the second diode layer is formed. The second metal layer may include metallic material for bonding.

The third substrate is bonded on the third insulating layer 40 by the intermediate of the second metal layer for connecting the second metal layer of the third substrate and the third metal lines 48 in the third insulating layer 40 that is not connected with the first resistors 42. A metallic material that is to be used for bonding may be formed on the third insulating layer 40. For forming second diodes at a desired thickness, a portion of the third substrate may be then polished or separated away.

The third substrate is patterned to form second diodes 53. Thus, the second diodes 53 are electrically connected with a first metal line 18 that is not connected with the first diodes 53 or the second metal line 38. The second diodes 53 are connected with the first metal line 18 through the second and the third metal lines 38 and 48 in a vertical direction. The second diodes 53 are connected with other word line selection devices 12w that are not connected with the first diodes 23. The second diode 53 may be formed of a vertical structure.

The second diode 53 may have a second metal pattern 56m on a lower part facing the surface of the first substrate 11. The second metal pattern 56m is electrically connected with the first word line 16w or the second word line 46w, and thereby parasitic bipolar behavior can be basically restrained.

The third substrate may be patterned by two different methods. The first method includes patterning the second diode layer and the second metal layer into a line shape. The second diode layer of a line shape is then patterned to form a plurality of the second diodes 53 on the second metal pattern 56m of a line shape. The second method includes patterning the second diode layer and the second metal layer at once to form the second diodes 53 and the second metal patterns 66m. The second diode 53 and the second metal pattern 56m are then electrically insulated from adjacent second diode 53 and second metal pattern 56m.

Referring to FIG. 7C, a fourth insulating layer 60 covers the second diodes 53. Fourth metal lines 68 are formed in the fourth insulating layer 60 to be electrically connected with second diodes 53.

Second resistors 72 are formed to be electrically connected with the second diodes 53. The second resistor 72 is electrically connected with the fourth metal line 68. Thus, the second resistor 72 can be connected with the second diode 53 in series.

The second resistor 72 may include a phase changeable material layer or a unipolar resistor. The second resistor 72 may be formed in three layered structure including a lower electrode/a phase changeable material layer or a unipolar resistor/an upper electrode, or formed in two layered structure including a phase changeable material layer or a unipolar resistor/an upper electrode.

A fifth insulating layer 70 covers the second resistors 72. Fifth metal lines 78 are formed in the fifth insulating layer 70 to be connected with the second resistors 72. A second bit line 76b is also formed in the fifth insulating layer 70.

The second bit line 76b is electrically connected with the bit line selection device 12b that is formed at the first substrate 11. The second bit line 76b is electrically connected with the bit line selection device 12b through sequentially connected the first, the second, the third, the fourth and the fifth metal lines 18, 38, 48, 68 and 78. The first, the second, the third, the fourth, the fifth metal lines 18, 38, 48, 68 and 78 may be formed by respective process steps. Alternatively the first, the second, the third, the fourth, the fifth metal lines 18, 38, 48, 68 and 78 may be formed at once.

Therefore, a non-volatile memory device that includes a first cell array having the first diodes 23 and the first resistors 42, and a second cell array having the second diodes 53 and the second resistors 72 are fabricated FIGS. 8A through 8E are schematic cross-sectional views illustrating a method of fabricating a non-volatile memory device according to another embodiment of the present inventive concept.

Figure 8A:
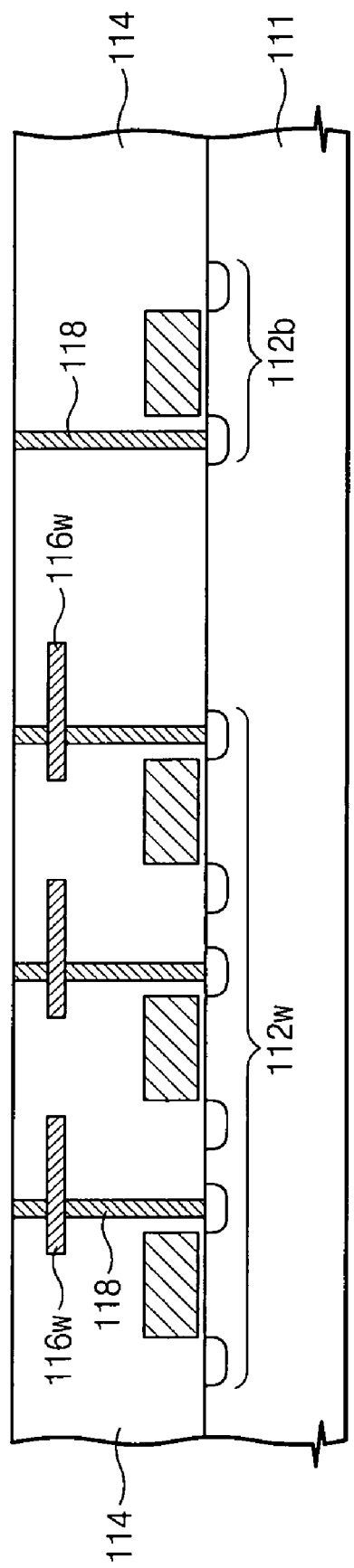

Referring to FIG. 8A, a first substrate 111 is prepared. Circuit devices 112b and 112w are formed on the first substrate 111.

The circuit devices 112b and 112w may be transistors and include a bit line selection device 112b and a plurality of word line selection devices 112w. A first insulating layer 114 covers the first substrate 111 that includes the circuit devices 112b and 112w. First metal lines 118 are formed in the first insulating layer 114 to be electrically connected with impurity regions of the circuit devices 112b and 112w. First word lines 116w may be formed in the first insulating layer 114. The first word lines 116 are electrically connected with the first metal lines 118.

Although the circuit devices 112b and 112w are shown as a plurality of the word line selection devices 112w and one bit line selection device 112b, a plurality of the word line selection devices 112w and a plurality of the bit line selection devices 112b may be disposed on the substrate 111. The first metal lines 118 may have a more complex structure than that shown in FIG. 1, and the first word lines 116w may be disposed over the substrate 11 and may be connected at some point of the substrate 111.

Figure 8B:
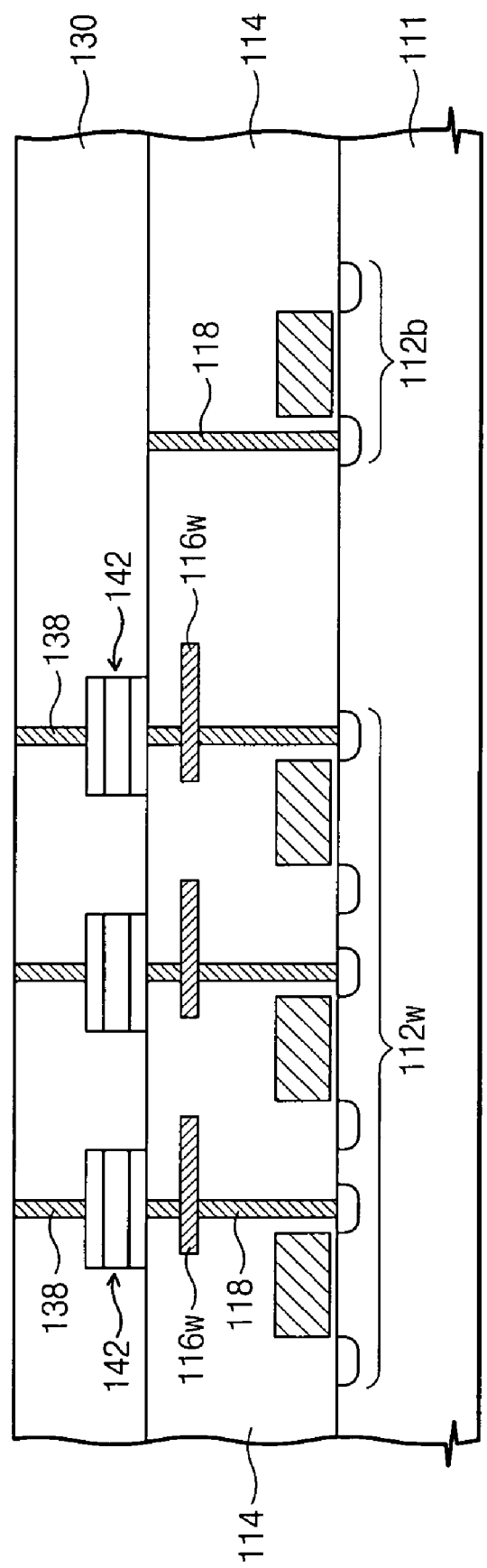

Referring to FIG. 8B, first resistors 142 are formed to be electrically connected with the word line selection devices 112w. The resistors 142 can be electrically connected with the word line selection devices 112w as being connected with the first metal lines 118.

The first resistor 142 may include a phase changeable material layer and a unipolar resistor. The first resistor 142 may be formed in a three layered structure including a lower electrode/a phase changeable material layer or a unipolar resistor/an upper electrode, or formed in a two layered structure including a phase changeable material layer or a unipolar resistor/an upper electrode.

A second insulating layer 130 covers the first resistors 142. Second metal lines 138 are disposed in the second insulating layer 130 to be connected with the first resistors 142.

Figure 8C:
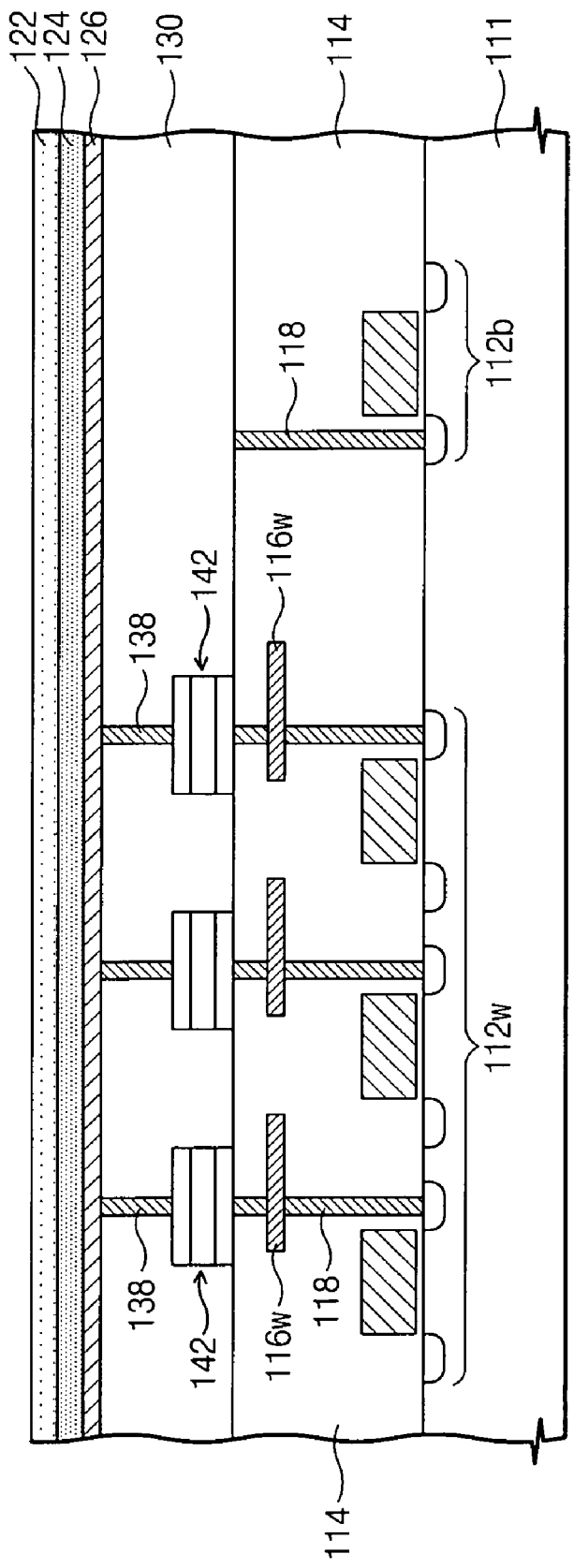

Referring to FIG. 8C, a second substrate is prepared. The second substrate includes a first diode layer 122 and 124 and a first metal layer 126. The first diode layer 122 and 124 is a doped layer of the second substrate in which different impurities are doped by using an implantation process. Alternatively, the first diode layer 122 and 124 are formed by epitaxial growth. The first diode layer 122 and 124 includes an n-type layer 124 and a p-type layer 122, respectively. In contrast, the diode layer 122 and 124 may include a p-type layer 122 and an n-type layer 122, respectively. The first diode layer 122 and 124 may have a structure of a unidirectional diode.

The first metal layer 126 may be formed on the second substrate on which the first diode layer 122 and 124 are formed. The first metal layer 126 may have metallic material that is to be used for bonding.

The second substrate is bonded to the first substrate 111 by the intermediate of the first metal layer 126 for connecting the second metal lines 138 in the second insulating layer 130 and the first metal layer 126 of the second substrate. Metallic material that is to be used for bonding may be formed on the second insulating layer 130. For forming first diodes at a desired thickness, a portion of the second substrate may be then polished or separated away.

Referring to FIG. 8D, the second substrate is patterned to form first diodes 123. The first diodes 123 may be electrically connected with the second metal lines 138 in a vertical direction from the first substrate 111, and the first diodes 123 are electrically connected with the first resistors 142 in series. The first diodes 123 may be formed of a vertical structure.

The first diode 123 may have a first metal pattern 126m on a lower part of the first diode 123 facing a surface of the first substrate 111. The first metal pattern 126 is electrically connected with the second metal line 138. Therefore, parasitic bipolar behavior can be basically restrained.

The second substrate may be patterned by two different methods. The first method includes patterning the first diode layer 122 and 124 and the first metal layer 126 into line shape. The first diode layer 122 and 124 of line shape are then patterned to form a plurality of the first diodes 123 on the first metal pattern 126m of line shape. The second method includes patterning the first diode layer 122 and 124 and the first metal layer 126 to form the first diodes 123 and the first metal patterns 126m at once. The first diode 123 and the first metal pattern 126m are then electrically insulated from adjacent first diode 123 and first metal pattern 126m.

Figure 8E:
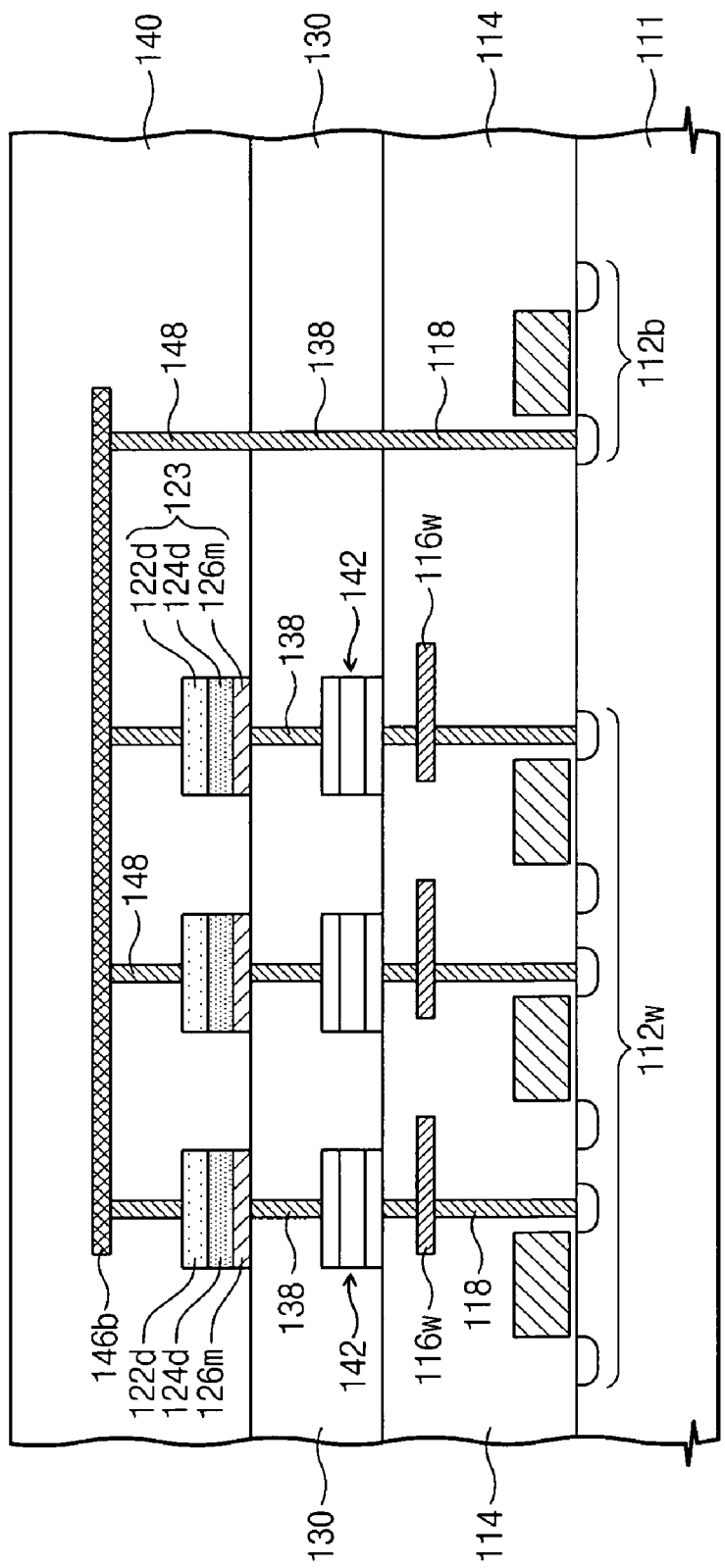

Referring to FIG. 8E, a third insulating layer 140 covers the first diodes 123. Third metal lines 148 are formed in the third insulating layer 140 to be electrically connected with first diodes 123. A first bit line 146b is disposed in the third insulating layer 140 to be connected with the third metal lines 148. The first bit line 146b is electrically connected with the bit line selection device 112b through sequentially connected first, second and third metal lines 118, 138 and 148. The first metal line 118, the second metal line 138 and the third metal line 148 may be formed by respective process steps. Alternatively the first metal line 118, the second metal line 138 and the third metal line 148 may be formed at once.

Therefore, a non-volatile memory device is formed, which includes a cell array having the first diodes 123 and the first resistors 142.

Figure 9A:
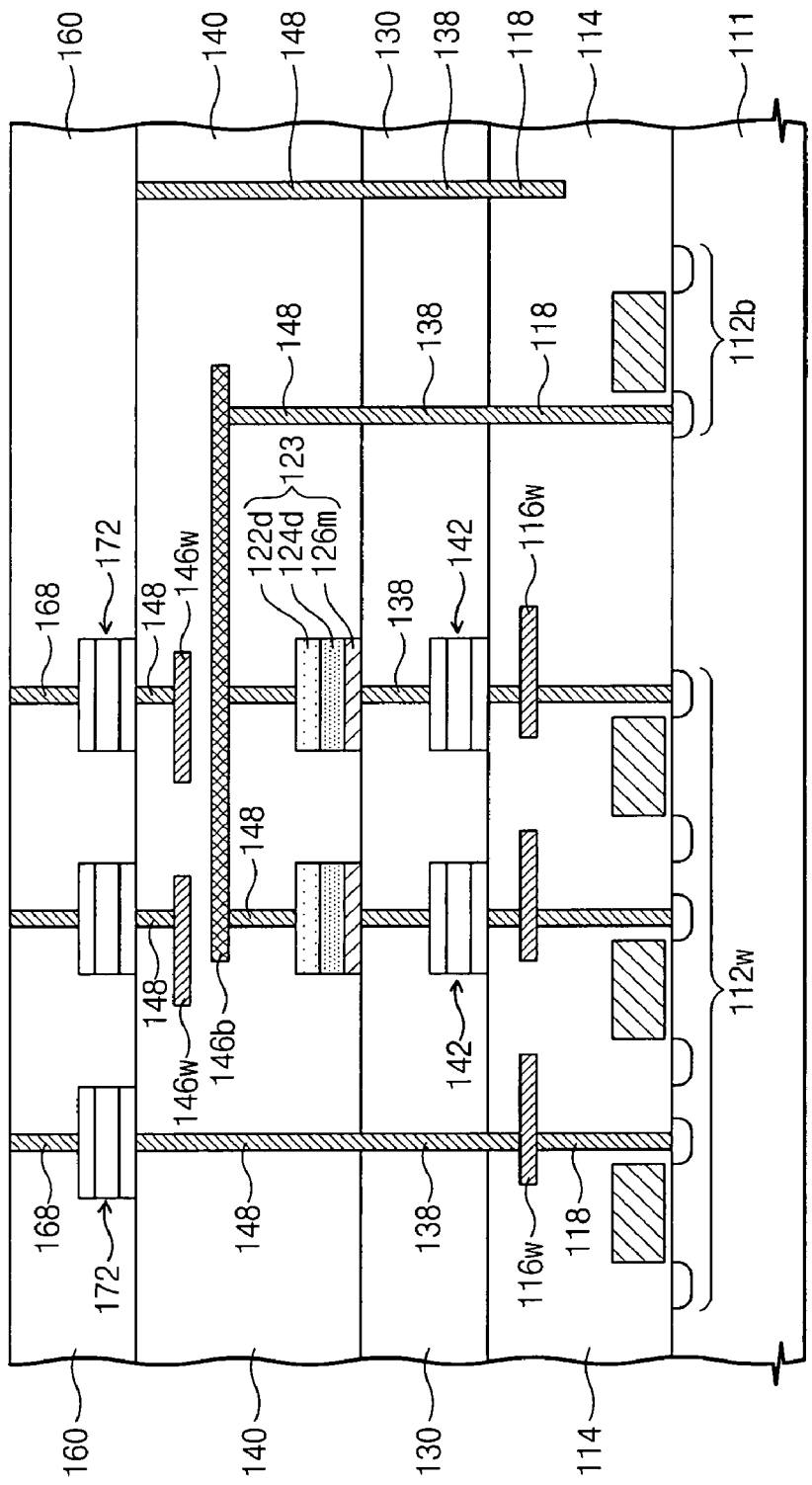
FIGS. 9A through 9C are schematic cross-sectional views illustrating a method of fabricating a stack-type non-volatile memory device according to another embodiment of the present inventive concept.
Figure 9B:
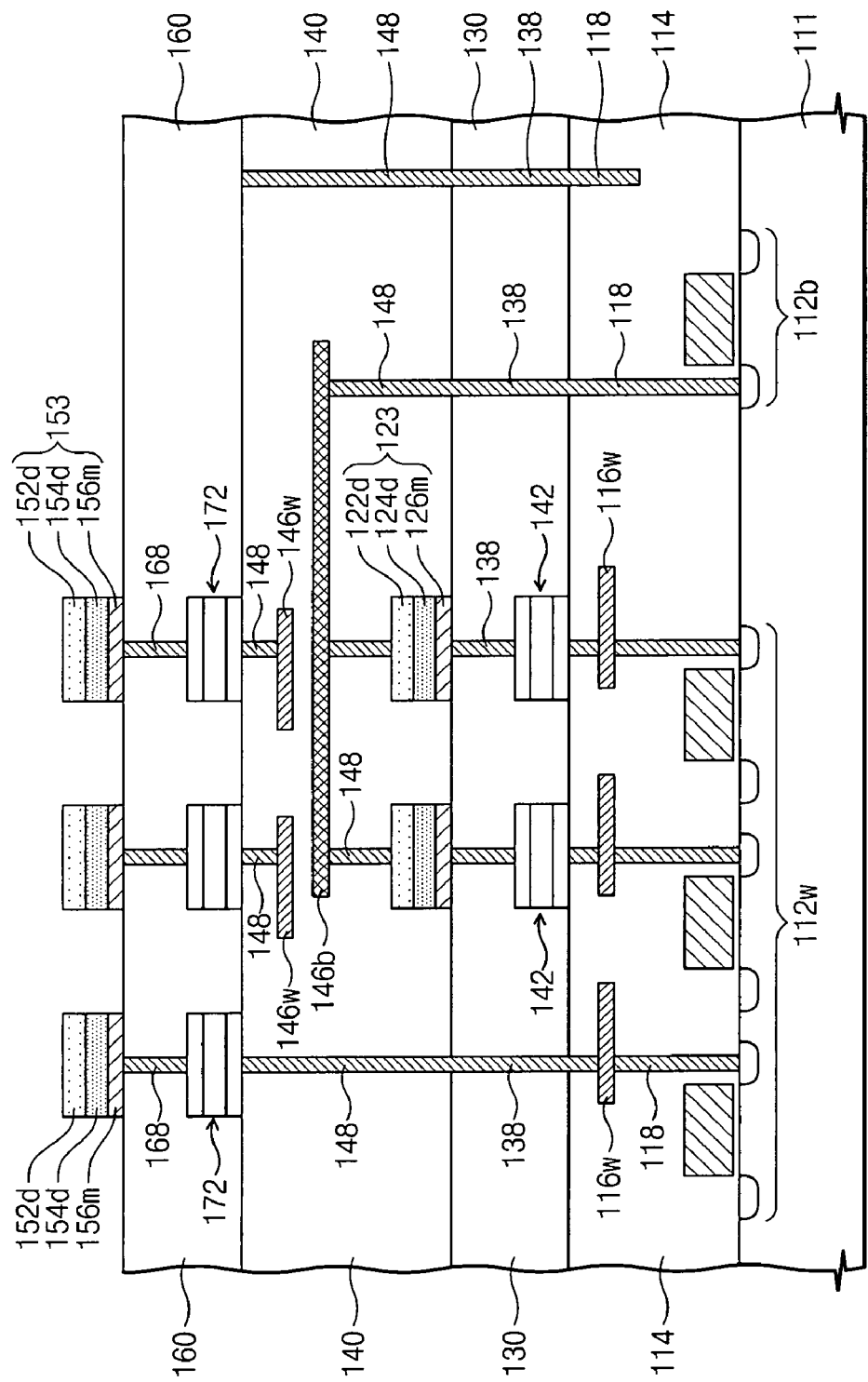
Figure 9C:
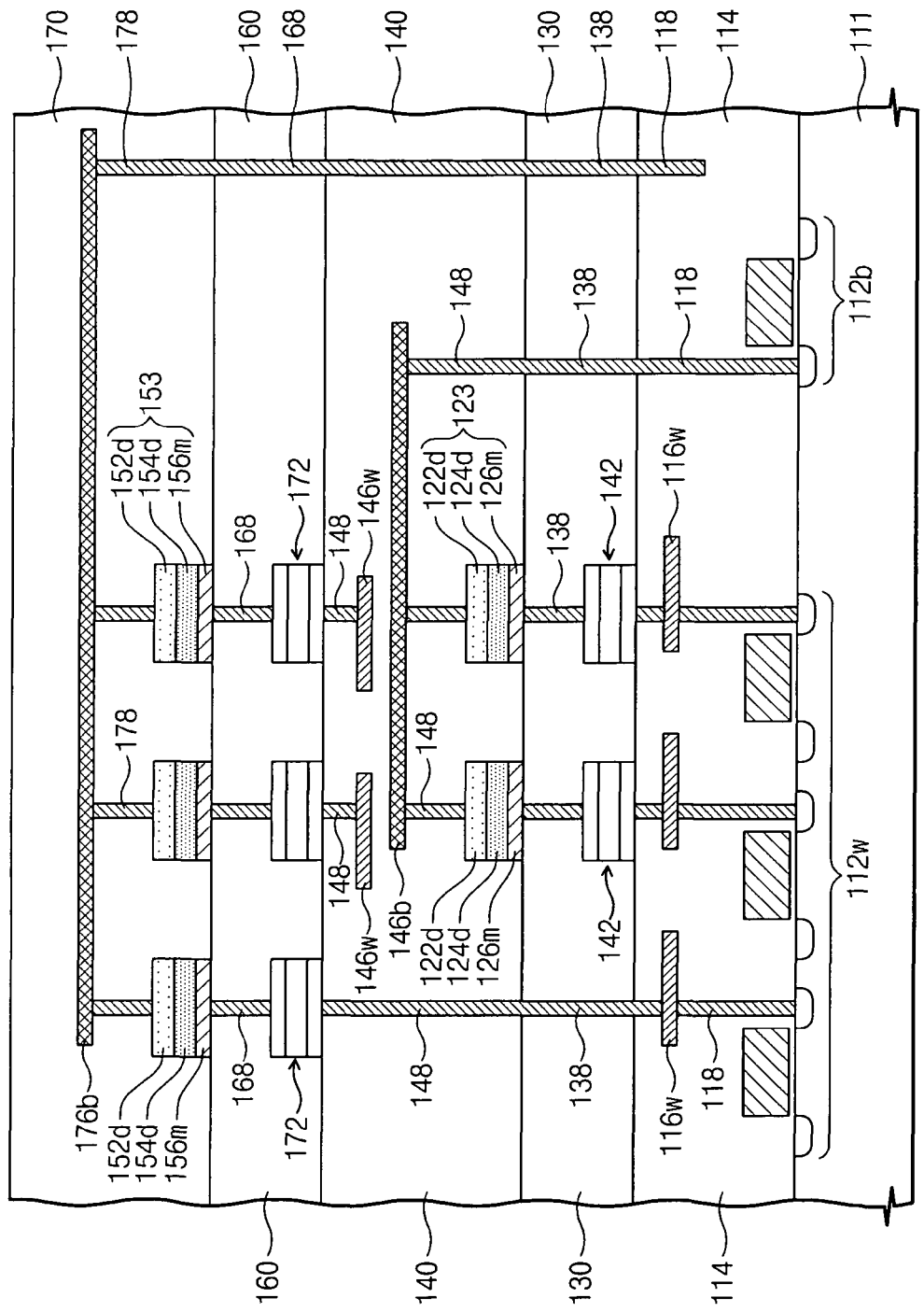

FIGS. 9A through 9C are schematic cross-sectional views illustrating a method of fabricating a stack-type non-volatile memory device according to another embodiment of the present inventive concept. A method of fabricating a second cell array is described using the resultant structure of FIG. 8E.

Referring to FIG. 9A, second resistor 172 is formed, which are electrically connected with other portions of the first metal lines 118 through the second and the third metal lines 138 and 148. The second resistors 172 can be connected with other word line selection devices 112w that are not connected with the first resistors 142.

The second resistor 172 may include a phase changeable material layer or a unipolar resistor. The second resistor 172 may be formed in a three layered structure including a lower electrode/a phase changeable material layer or a unipolar resistor/an upper electrode, or formed in a two layered structure including a phase changeable material layer or a unipolar resistor/an upper electrode.

A fourth insulating layer 160 covers the second resistors 172. Fourth metal lines 168 are formed in the fourth insulating layer 160 to be connected with the second resistors 172.

Referring to FIG. 9B, a third substrate is prepared, which includes a second diode layer and a second metal layer. The third substrate may have the same structure of the second substrate described above.

The second diode layer may be formed by implanting different impurities into the third substrate of mono-crystalline silicon. The second diode layer may also be formed by epitaxial growth. The second diode layer includes an n-type layer and a p-type layer. The n-type layer and the p-type layer can be exchanged in position. Therefore, a second diode may be formed of unidirectional diode structure.

The second metal layer may be formed on the third substrate on which the second diode layer is formed. The second metal layer may include metallic material that is to be used for bonding.

The third substrate is bonded on the forth insulating layer 160 by the intermediate of the second metal layer to connect the second metal layer and the forth metal lines 168 that is not connected with the first diodes 123. A metallic material that is to be used for bonding may be formed on the forth insulating layer 160. For forming second diodes at a desired thickness, a portion of the third substrate may be then polished or separated away.

The third substrate is patterned to form second diodes 153. Thus, the second diodes 153 are electrically connected with a fourth metal line 168 in a vertical direction from the first substrate 111. The second diode 153 is connected with the second resistor 172 in series. The second diode 153 may be formed of vertical structure.

The second diode 153 may have a second metal pattern 156m on a lower part of the second diode 153 facing the surface of the first substrate 111. The second metal pattern 156m is electrically connected with the fourth metal line 168. Therefore parasitic bipolar behavior can be basically restrained.

The third substrate may be patterned to form the second diodes 153 and the second metal patterns 126m at once. The second diode 153 and the second metal pattern 156m are then electrically insulated from adjacent second diode 153 and second metal pattern 156m.

Referring to FIG. 9C, a fifth insulating layer 170 covers the second diodes 153. Fifth metal lines 178 are formed in the fifth insulating layer 170 to be electrically connected with second diodes 123.

A second bit line 176b is electrically connected with the bit line selection device 112b that is formed at the first substrate 111. The second bit line 176b is electrically connected with the bit line selection device 112b through sequentially connected first, second, third, fourth and fifth metal lines 118, 138, 148, 168 and 178. The first, the second, the third, the fourth, the fifth metal lines 118, 138, 148, 168 and 178 may be formed by respective process steps. Alternatively the first, the second, the third, the fourth, the fifth metal lines 118, 138, 148, 168 and 178 may be formed at once.

Therefore a non-volatile memory device is formed, which includes a first cell array having the first diodes 123 and the first resistors 142, and a second cell array having the second diodes 153 and the second resistors 172.

According to embodiments of the present inventive concept, the non-volatile memory device can be fabricated by a simplified process without high temperature, because bonding, patterning, insulating and interconnection processes are only used for forming diodes. Stacking cell arrays can be readily accomplished, and the non-volatile memory device with high reliability can be fabricated.

Figure 10:
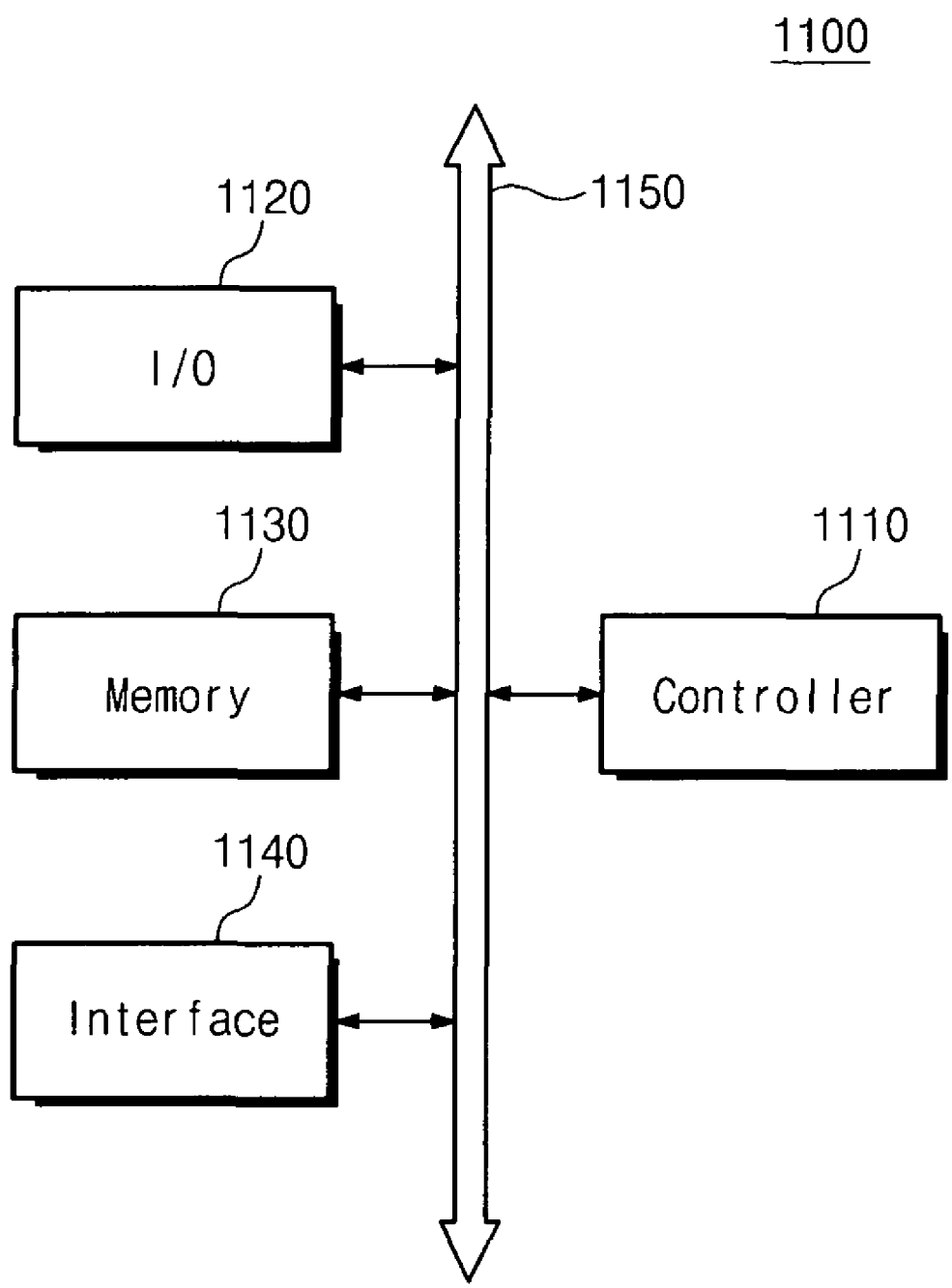
FIG. 10 is a schematic functional block diagram illustrating a memory system that includes a non-volatile memory device according to embodiments of the present inventive concept.

FIG. 10 is a block diagram illustrating a memory system that includes a non-volatile memory device according to embodiments of the present inventive concept.

Referring to FIG. 10, memory system 1100 is applicable to a personal digital assistant (PDA), a portable computer, a web tablet, a wireless phone, a mobile phone, a digital music player, a memory card or applications capable of transmitting and/or receiving information in environment.

The memory system 1100 includes a controller 1110, input/output devices 1120 such as a key pad, a key board and display, memory 1130, an interface 1140 and a bus 1150. The memory 1130 and the interface 1140 communicate each other through the bus 1150.

The controller 1110 includes at least one of a microprocessor, a digital signal processor, a microcontroller, or other processing devices. The memory 1130 stores commands that are processed by the controller 1110. The input/output device 1120 is used to receive data or signals from the outside, and send data or signals from the system 1100.

The memory 1130 includes a non-volatile memory device according to embodiments of the present inventive concept. The memory 1130 may further include a memory that is accessible at any time, and/or other types of memories.

The interface 1140 transmits data to a network or receives data from a network.

Figure 11:
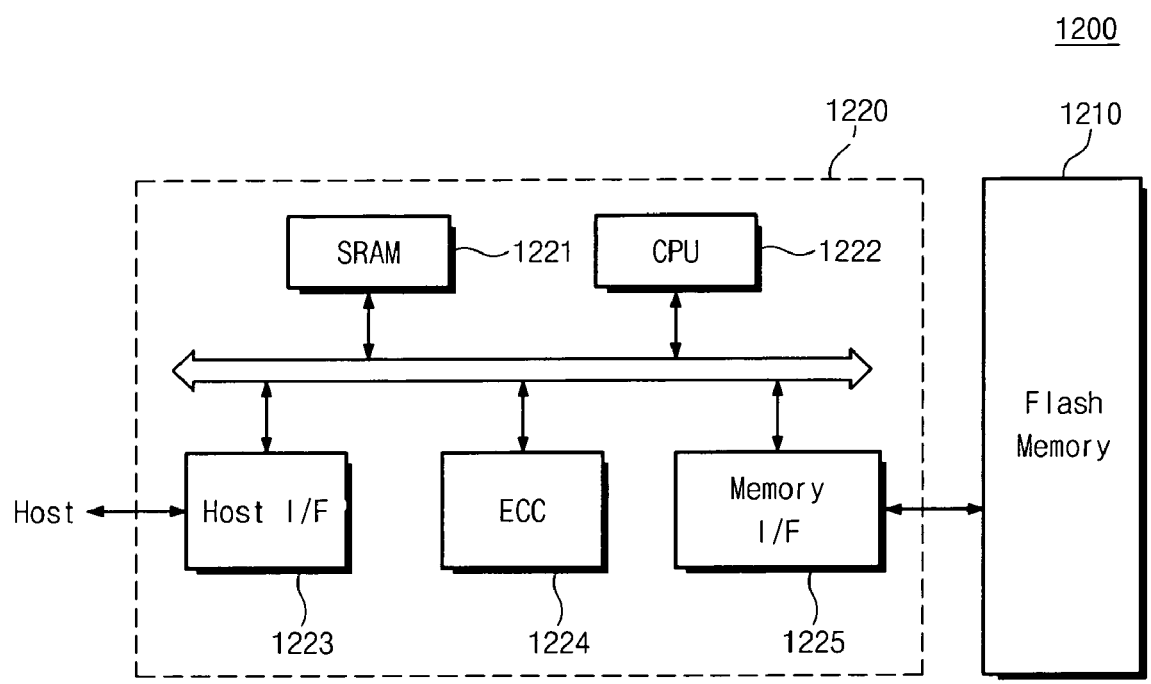
FIG. 11 is a schematic functional block diagram illustrating a memory card that includes a non-volatile memory device according to embodiments of the present inventive concept.

FIG. 11 is a block diagram illustrating a memory card that includes a non-volatile memory device according to embodiments of the present inventive concept.

Referring to FIG. 11, memory card 1200 supporting mass storage incorporates a non-volatile memory device 1210 according to embodiments of the present inventive concept. The memory card 1200 according to embodiments of the present inventive concept includes a memory controller 1220 that manages data exchange between a host and the non-volatile memory device 1210.

SRAM (Static Random Access Memory) 1221 is used as an operating memory for CPU (Central Processing Unit) 1222. Host interface 1223 includes data exchange protocol of the host connected with the memory card 1200. Error correction coding (ECC) block 1224 detects and corrects error that is included in read data from the non-volatile memory device 1210. Memory interface 1225 interfaces with the non-volatile memory device 1210. The CPU manages the memory controller to exchange data. The memory device may further include ROM (Read Only Memory) that stores code data for interfacing with the host.

According to embodiments of the present inventive concept, a memory system with high reliability can be provided by incorporating a non-volatile memory device of which erasing characteristic of dummy cell is enhanced. The non-volatile memory device according to embodiments of the present inventive concept is applicable to a memory system such as solid state drive (SSD), thereby provides a memory system with high reliability that can interrupt read error induced from dummy cells.

Figure 12:
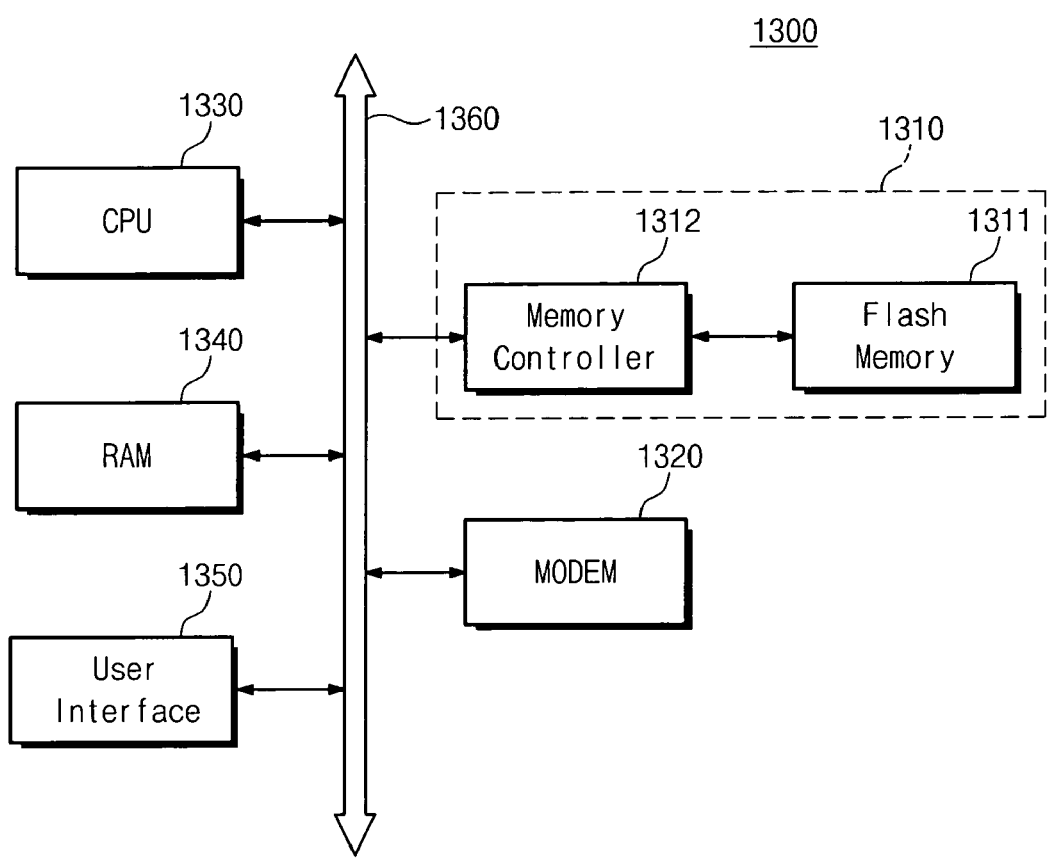
FIG. 12 is a schematic functional block diagram illustrating a data processing system that includes a non-volatile memory device according to embodiments of the present inventive concept.

FIG. 12 is a block diagram illustrating a data processing system that includes a non-volatile memory device according to embodiments of the present inventive concept.

Referring to FIG. 12, the memory device according to embodiments of the present inventive concept may be embedded in a data processing system such as a mobile device or a desktop computer. The data processing system 1310 includes non-volatile memory system 1310, and a modem 1320, a CPU 1330, a RAM 1340 and an user interface that are electrically connected with a bus 1360, respectively. The non-volatile memory system 1310 may be the memory system described in FIG. 10. Data processed by the CPU 1330 or input from the outside is stored in the non-volatile memory system 1310. The memory system may a solid state drive. Thus the data processing system can store stably a mass of data in the non-volatile memory system 1310. If reliability is enhanced, the non-volatile memory device 1310 can reduce resources use for correcting error and can provide high data exchange performance to the data processing system 1300. The data processing system 1300 according to embodiments of present inventive concept may further include an application chipset, an image signal processor (ISP), and an input/output device.

The non-volatile memory device or memory system according to embodiments of the present inventive concept may be embedded into various packages, such as a PoP (Package on Package), a BGA (Ball Grid Array), a CSP (Chip Scale Package), a PLCC (Plastic Leaded Chip Carrier), a PDIP (Plastic Dual In-line Package), a die in waffle pack, a die in wafer form, a COB (Chip On Board), a CERDIP (CERamic Dual In-line Package), a MQFP (plastic Metric Quad Flat Pack), a TQFP (Thin Quad Flat Pack), a SOIC (Small-Outline Integrated Circuit), a SSOP (Shrink Small-Outline Package), a TSOP (Thin Small Outline Package), a SIP (System In Package), a TQFP (Thin Quad Flat Pack), a MCP (Multi Chip Package), a WFP (Wafer-level Fabricated Package) or a WSP (Wafer-level processed Stack Package).

According to embodiments of the present inventive concept, a metal layer is formed to a bottom surface of a diode that is a selection device, thereby providing a non-volatile memory device with high reliability. Since the metal layer on the bottom of the diode is used for a bottom electrode of the diode, a word line and a bit line in the cell array can be formed of metal lines, and, therefore, operation performance of the non-volatile memory device is enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory device, comprising:
    a substrate including a circuit device and a metal line electrically connected with the circuit device;
    a diode connected with the metal line in a vertical direction with respect to a surface of the substrate, and including a metal layer disposed on a lower part of the diode facing the surface of the substrate; and
    a resistor electrically connected with the diode in series.

2. The device of claim 1, wherein the diode comprises mono-crystalline silicon.

3. The device of claim 1, wherein the resistor includes phase changeable material or a mono-polar resistor.

4. The device of claim 1, wherein the resistor is disposed over or under the diode in the vertical direction.

5. The device of claim 1, wherein the resistor is a via pattern.

6. The device of claim 1, further comprising:
    an additional diode connected with another metal line electrically connected with another circuit device in the vertical direction, and disposed at a position higher than that of the diode; and
    an additional resistor electrically connected with the additional diode in series,
    wherein the additional diode includes a metal layer on a lower part of the additional diode facing the surface of the substrate.

7. The device of claim 6, wherein the additional resistor is disposed over or under the additional diode in the vertical direction.

8. A non-volatile memory device, comprising:
    a substrate including circuit devices and metal lines electrically connected with each of the circuit devices;
    a first diode connected with one of the metal lines in a vertical direction with respect to a surface of the substrate;
    a first resistor electrically connected with the first diode in series;
    a second diode connected with another metal line in a vertical direction with respect to the surface of the substrate, and disposed at a position higher than that of the first diode; and a second resistor electrically connected with the second diode in series,
    wherein the first diode includes a metal layer on a lower part of the first diode facing the substrate, and the second diode includes a metal layer on a lower part of the second diode facing the substrate.

9. The device of claim 8, wherein the first and second diodes comprise mono-crystalline silicon.

10. The device of claim 8, wherein each of the first and the second resistors includes phase changeable material or a mono-polar resistor.

11. The device of claim 8, wherein the first resistor is disposed over or under the first diode in the vertical direction.

12. The device of claim 8, wherein the second resistor is disposed over or under the second diode in the vertical direction.

* * * * *